United States Patent [19]

Rogers

[11] Patent Number: 5,049,763
[45] Date of Patent: Sep. 17, 1991

[54] ANTI-NOISE CIRCUITS

[75] Inventor: Alan C. Rogers, South Portland, Me.

[73] Assignee: National Semiconductor Corporation, Santa Clara, Calif.

[21] Appl. No.: 327,348

[22] Filed: Mar. 22, 1989

[51] Int. Cl.$^5$ .................... H03K 17/16; H03K 19/03; H03K 19/92

[52] U.S. Cl. .................... 307/443; 307/475; 307/542; 307/544

[58] Field of Search ............ 307/443, 448, 451, 325, 307/246, 296.1, 264, 289, 263, 54 R, 473, 475, 362, 572

[56] References Cited

U.S. PATENT DOCUMENTS

| | | | |
|---|---|---|---|
| 3,898,482 | 8/1975 | Holt, Jr. | 307/542 |
| 3,974,404 | 8/1976 | Davis | 307/475 |
| 4,609,834 | 9/1986 | Gal | 307/443 |
| 4,613,771 | 9/1986 | Gal | 307/443 |
| 4,680,613 | 7/1987 | Daniels et al. | 357/72 |
| 4,777,389 | 10/1988 | Wu et al. | 307/263 |
| 4,782,252 | 11/1988 | Levy et al. | 307/289 |
| 4,791,521 | 12/1988 | Ouyang et al. | 307/542 |
| 4,864,164 | 9/1989 | Ohshima et al. | 307/451 |
| 4,883,978 | 11/1989 | Ohshima et al. | 307/443 |
| 4,906,867 | 3/1990 | Petty | 307/473 |
| 4,920,283 | 4/1990 | Elmer et al. | 307/443 |
| 4,961,010 | 10/1990 | Davis | 307/443 |
| 4,963,774 | 10/1990 | Masuda | 307/443 |

FOREIGN PATENT DOCUMENTS 57-164548 10/1982 Japan .

WO86/05322 9/1986 PCT Int'l Appl. .

Primary Examiner—Stanley D. Miller
Assistant Examiner—Toan Tran
Attorney, Agent, or Firm—Lee Patch; Daniel H. Kane

[57] ABSTRACT

Low noise circuits for single stage and multi-stage circuits reduce power rail noise, including both ground noise and supply noise caused by output power rail ground lead and supply lead inductance. Anti-bounce circuits reduce ground bounce by suppressing turn on of the output stage pulldown transistor element during transient occurrence of ground bounce events. Similarly anti-droop circuits reduce output supply $V_{cc}$ droop by suppressing turn on of the output stage pulldown transistor element during transient occurrence of $V_{cc}$ droop events. Anti-undershoot circuits dissipate ground undershoot energy by establishing a transient sacrificial current flow through the parasitic output ground tank circuit following transition from high to low potential at the output and by prolonging the sacrificial current flow during transient occurrence of ground undershoot events. Similarly anti-overshoot circuits dissipate overshoot energy in the parasitic output supply tank circuit by establishing a sacrificial current flow during transient occurence of $V_{cc}$ overshoot events. Ground noise and power noise detectors are used for detecting occurrence of bounce, droop, undershoot and overshoot for actuating and enhancing operation of the low noise circuits. The power rail noise detectors and antinoise circuits are combined in various combinations and permutations.

88 Claims, 11 Drawing Sheets

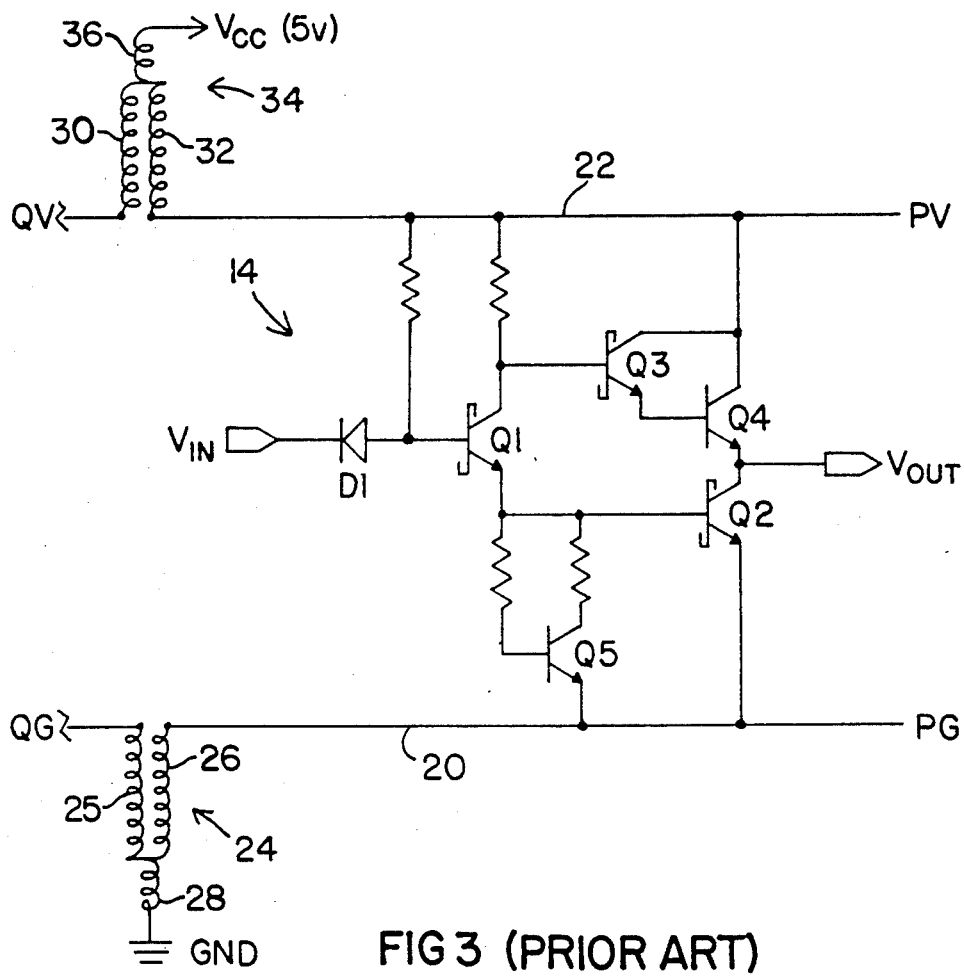
FIG 3 (PRIOR ART)
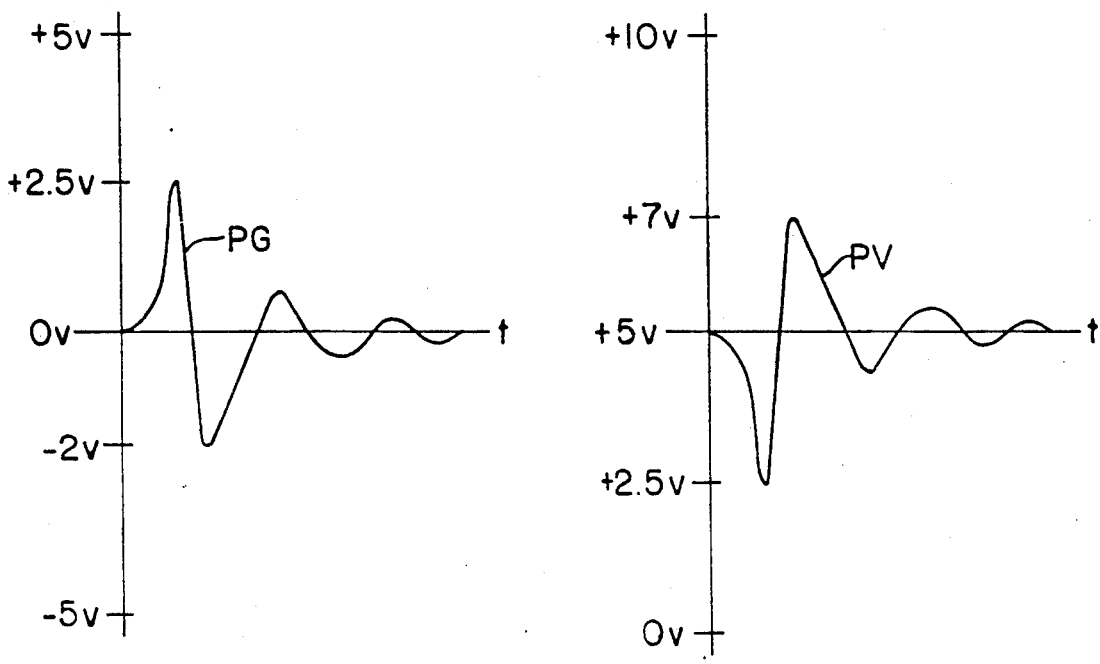
FIG 4 (PRIOR ART)
FIG 5 (PRIOR ART)

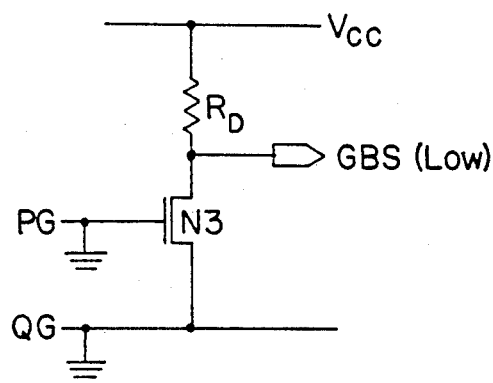
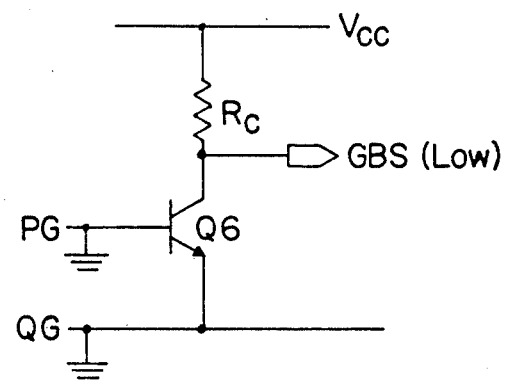
FIG 6    FIG 6A
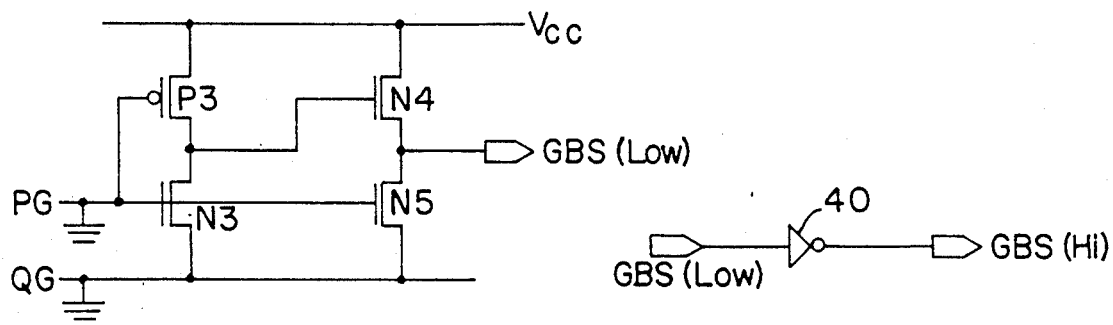
FIG 7    FIG 7A
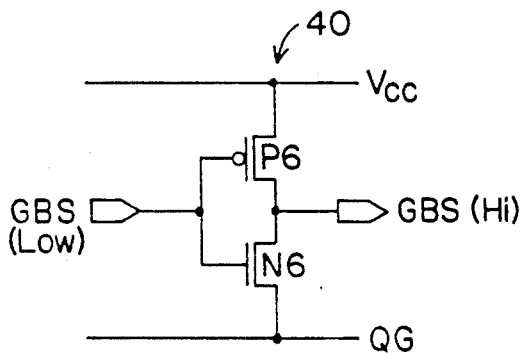
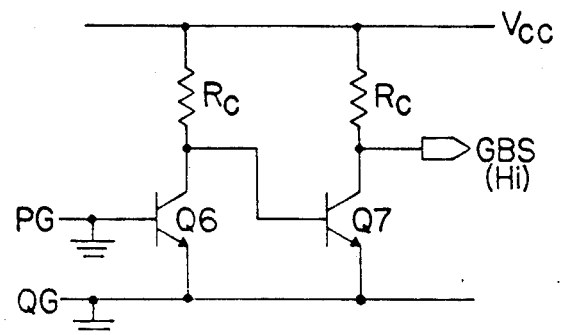
FIG 7B    FIG 8

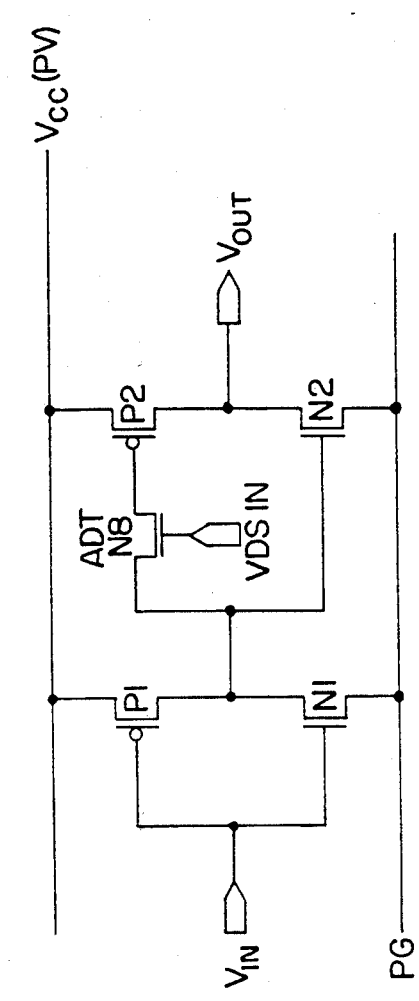
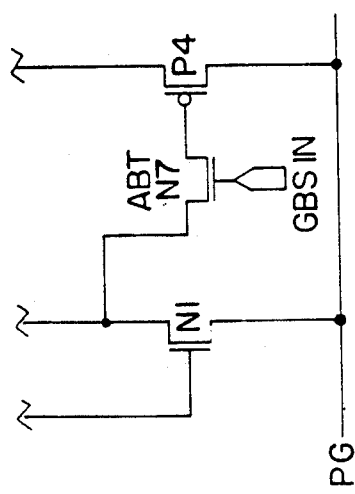
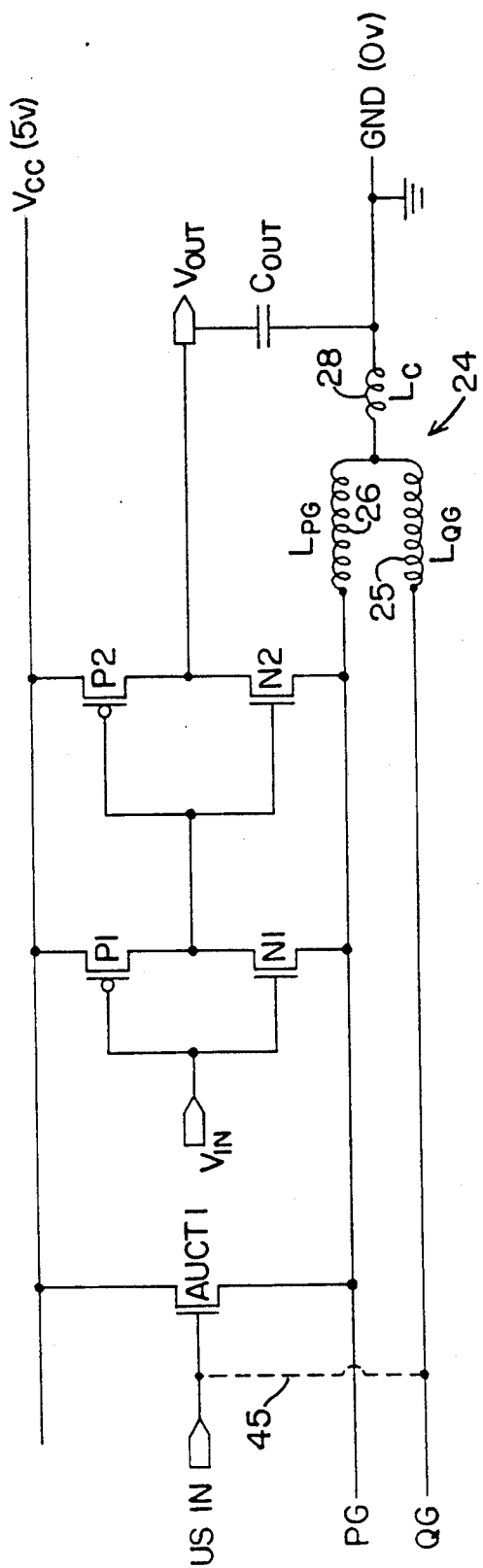
FIG 17
FIG 16
FIG 18

ANTI-NOISE CIRCUITS

TECHNICAL FIELD

This invention relates to low noise circuits for suppressing and dissipating parasitic tank circuit energy and is particularly applicable for single stage and multistage integrated circuits. Anti-noise circuits are provided for suppressing and reducing ground bounce and $V_{cc}$ droop in the output stage caused by storage of parasitic tank circuit energy in the output ground lead inductance and power supply lead inductance. Anti-noise circuits are also provided for dissipating ground undershoot energy, power supply overshoot energy, and subsequent ringing in the parasitic tank circuits of the ground and power circuits. Ground noise and power noise detectors are described for detecting occurrence of bounce, droop, undershoot and overshoot for actuating and enhancing operation of the low noise circuits.

BACKGROUND ART

A fragmentary portion of a multi-stage integrated circuit 10 is illustrated in FIG. 1 with an input stage 12 and an output stage 14. The input stage 12 is coupled to an input ground line 15 providing a relatively quiet ground (QG) and an input supply line 16 providing a relatively quiet $V_{cc}$ supply (QV). The input stage 12 includes input 17 and output 18 for data signals of high and low potential and may be coupled to other internal stages or to output stage 14.

The output stage 14 incorporates an input $V_{in}$ for receiving signals of high and low potential from input stage 12 or other internal stage and an output $V_{out}$ for delivering data signals. The output stage is coupled to an output ground line 20 which forms a relatively noisy power ground or output ground (PG) and an output supply line 22 which forms a relatively noisy power $V_{cc}$ supply or output $V_{cc}$ supply (PV).

The input quiet ground line QG and output ground line PG are relatively isolated by respectively coupling to the split lead fingers 25 and 26 of a lead frame split lead 24. The input and output ground lines 15, 20 therefore each incorporate the separate lead inductance associated with the respective split lead fingers 25, 26. They are relatively isolated for coupling to a common external ground through the relatively low common inductance coupling of the common lead portion 28 of the lead frame split lead 24. The common external ground of 0 volts (Ov) is designated GND. Such a split lead frame lead is illustrated in FIG 1A with its equivalent circuit inductances shown in FIG. 1.

The input and output supply lines 16, 22 are relatively isolated by coupling to the split lead fingers 30, 32 respectively of lead frame power supply split lead 34. The separate supply lead inductance associated with the respective split lead fingers 30, 32 is shown if FIG.1. The input and output supply lines 16, 22 are coupled to a common external $V_{cc}$ supply, typically 5 volts, designated $V_{cc}$ through the relatively low common inductance coupling associated with the common split lead portion 36.

Such lead frame split leads 24, 34 for relative isolation of input and output ground rails and supply rails are further described for example in copending U.S. Pat. application Ser. No. 243,195 for DYNAMIC GROUND REFERENCE CHANGER FOR MULTIPLE STAGE INTEGRATED CIRCUITS, filed Sept. 8, 1988 an FWC.Continuation of U.S. Pat. application Ser. No. 880,407 for REDUCTION IN POWER RAIL PERTURBATION filed June 30, 1986, abandoned; the Natsui Japan Patent Document 57-164548 dated Oct. 9, 1982; and the Watanabe European Patent Application 86901518.0 filed in the EPO Feb. 28, 1986, corresponding to International Application No. PCT/JP86/00106 published Sept. 12, 1986 as International Publication No. WO86/05322.

As shown in FIG.1, relative isolation of the input and output ground rails 15, 20 and the input and output supply rails 16, 22 through a single ground lead 28 and a single supply lead 36 is permitted by a split lead configuration. Alternatively, chips and chip packages are now being provided with multiple separate ground leads and supply leads for better separation. In that event, the input and output ground rails 15, 20 can be routed to external ground through entirely separate ground leads and pins. Input and output supply rails 16, 22 can be coupled to external power supply $V_{cc}$ through entirely separate supply leads and pins. In these new chip and pin designs, multiple power leads and pins and multiple ground leads and pins are being provided for the purposes of separation only.

As used in this discussion of background, and subsequently in the specification and claims, the phrases "power rails" and "power leads" are used generically to include both ground rails and ground leads on the one hand and supply rails and supply leads on the other hand. Thus, the relatively quiet power rails include the input quiet ground rail QG and the input quiet supply rail QV. The relatively noisy power rails include the output ground rail PG and the output supply rail PV. Generally the words "rail" and "lead" may be used synonymously, implying a conductor or line on the chip with coupling to external ground or supply.

In the case of CMOS integrated circuits as illustrated in FIG. 2, the output stage 14 includes a pulldown transistor element, in this case NMOS transistor N2 for sinking current from the output $V_{out}$ to output ground PG, and an output pullup transistor element, in this case PMOS transistor P2 coupled between the output $V_{cc}$ supply PV and the output $V_{out}$ for sourcing current from high potential to the output. The output stage 14 incorporates three current amplification stages. In this example two amplification stages are provided by transistor pairs P1, N1 and PIA, NIA preceding the pullup and pulldown transistor elements P2, N2.

In the case of bipolar integrated circuits, the output stage 14 as illustrated in FIG. 3 typically incorporates a bipolar output device with pulldown transistor element Q2, pullup Darlington transistor elements Q3, Q4, phase splitter transistor element Q1, input diode D1 and squaring network including transistor Q5 at the base of the pulldown transistor Q2.

Occurrence of ground bounce and undershoot in prior art multistage integrated circuits of the type shown in FIGS. 1, 2 and 3 is illustrated with reference to FIGS. 4 and 5. Considering in detail the equivalent circuit at the pulldown transistor element N2 of FIG. 2, pulldown transistor N2 sinks current from the output $V_{out}$ through the separate output ground lead inductance associated with split lead finger 26 and common lead inductance associated with the common split lead portion 28 to the external ground GND. The split lead construction minimizes the common lead inductance relatively isolating the quiet ground QG and its separate lead inductance associated with split lead finger 25. The output capacitance $C_{out}$ coupling to external ground GND adds a further capacitive reactance in the output ground circuit and completes a parasitic tank circuit including the output capacitance $C_{out}$ and output ground lead inductances $L_{pg}$ and $L_c$.

Referring to FIG. 2, upon transition from high to low potential at the output, pulldown transistor N2 turns on. The surge or acceleration of charge develops a voltage across the inductances $L_{pg}$ and $L_c$ equal to L di/dt (where $L=L_{pg}+L_c$) resulting in ground rise or ground bounce in the output ground PG as shown in the first positive peak in the output ground PG voltage illustrated in the graph of FIG. 4. The duration of occurrence of this ground rise or ground bounce is in the order of 2 to 3 nanoseconds (ns). Because of the ground rise in the output ground PG which may typically be in the order of 2 to 2.5 volts above ground 0 volts, the falling potential at the output momentarily pauses at a level determined by the ground rise in the output ground. A smaller pulse (not shown) of for example 1 volt appears on the relatively quiet ground QG, a result of the reduced common inductance $L_c$.

Occurrence of ground bounce may be analyzed according to the invention as follows. The total amount of charge in the load capacitance or output capacitance $C_{out}$ must be "dumped" or "drained" to ground through the output transistor N2. Some of the parasitic energy $\frac{1}{2} v^2 C_{out}$ represented by this stored charge (where $v=q/C_{out}$, v being the volts across the output capacitance and q the stored charge) may be dissipated in the power dissipation of the output transistor N2. The remainder energy in excess of the power dissipation in the output transistor is stored in the ground lead inductance as remainder parasitic energy $\frac{1}{2} i^2 L$. The voltage drop during current buildup across the parasitic inductance $L=L_{pg}+L_c$ appears as ground bounce. The magnitude of the ground bounce is proportional to the rate of change of current di/dt through the parasitic inductance which is in turn proportional to the acceleration of charge $d^2q/dt^2$ and the acceleration of voltage $d^2v/dt^2$ across the output capacitance $C_{out}$.

Referring to FIG. 2, deceleration of the initial surge of charge through pulldown transistor N2 causes a voltage drop across the ground lead inductance of opposite polarity equal to $-L$ di/dt resulting in a ground voltage undershoot of opposite polarity from the ground bounce. Ground undershoot may typically be as great as for example $-2$ volts as illustrated in the negative peak in the graph of output ground voltage PG in FIG. 4. The output capacitance $C_{out}$ in combination with the inductance $L=L_{pg}+L_c$ in the power ground circuit constitutes a parasitic tank circuit which stores inertial energy in the output ground lead inductance $L_{pg}$ and common inductance $L_c$. Subsequent ringing in the circuit results in further bounce and undershoot until the ground lead inductance energy is dissipated in the output transistor and related output circuit components.

Similar noise problems appear on the power supply side and supply leads of the output stage. As illustrated in FIG. 2, upon transition from low to high potential at the output, pullup transistor P2 becomes conducting with a surge or acceleration of charge from external power supply $V_{cc}$ to the output through the common inductance $L_c$ of the common portion 36 of supply split lead 34 and the separate lead inductance $L_{pv}$ of split lead finger 32. The inductive impedance and resulting voltage across this inductance equal to L di/dt causes transient droop of voltage in the output supply line PV at for example 2.5 volts, substantially below the $V_{cc}$ voltage of 5 volts. This so called $V_{cc}$ droop is illustrated in the first negative peak of the output supply voltage PV at 2.5 volts shown in the graph of FIG. 5. The voltage rise at the output $V_{out}$ is correspondingly delayed. A smaller droop pulse (not shown), for example 1 volt below the $V_{cc}$ level of 5 volts, appears on the quiet supply line QV as a result of the common inductance coupling $L_c$.

Deceleration of the initial surge of charge through pullup transistor P2 results in a following supply voltage overshoot of opposite polarity from the PV droop as shown in the positive peak of the graph of the supply voltage PV illustrated in FIG. 5. Subsequent droop and overshoot ringing persists until the inertial energy of the supply lead inductance is dissipated in the output pullup transistor and related output circuit components. PV overshoot may typically overshoot, for example, two volts above the $V_{cc}$ 5 volt level with corresponding effects at the output. Smaller droop and overshoot pulses (not shown) appear on the quiet supply QV.

Occurrence of $V_{cc}$ droop and overshoot may be analyzed according to the invention in the same manner as ground bounce and undershoot set forth above. $V_{cc}$ droop and overshoot, however, are effectively a "mirror image" of the ground bounce and undershoot. Both phenomena produce transient voltages and transient noise as a result of parasitic tank circuit energy associated with output capacitance and supply or ground lead inductance in the output stage. As set forth herein the phrases "parasitic tank circuit" and "paraitic tank circuit energy" are intended to refer to these comparable equivalent circuit structures and to the "mirror image" transient noise energy that occurs on both the supply and ground sides of the output stage.

The disruptive effects of this noise on the output ground PG and output supply PV lines includes pulsing of noise on the internal relatively quiet input ground QG and supply QV lines; radio frequency radiation interference (RFI) and electromagnetic induction interference (EMI) noise which may interfere with the host system; and local threshold shifts in the reference voltages for high and low potential data signals causing false data signals. Ground noise also adversely affects separate low or quiet outputs on a common bus. For example a low output on an octal buffer experiences a rise with ground bounce, possibly causing a false high signal. These problems associated with ground and supply noise have increased in more recent integrated circuits which switch higher currents at higher speeds.

One approach to reducing output ground noise and supply noise in integrated circuits prior to the development of split leads and prior to the recent use of multiple separate ground leads and pins and multiple separate supply lead and pins was to minimize lead inductance by the use of wider lead frame ground leads and supply leads and the use of ground planes as described for example in U.S. Pat. No. 4,680,613. With the advent of split leads, and the more recent use of separate ground leads and separate supply leads, the input stages may be relatively isolated from the noisy ground leads and supply leads of the output stages. Nevertheless ground bounce and undershoot and $V_{cc}$ droop and overshoot remain in the output stages particularly in the latest IC product generations with high drive and fast switching. Past methods to deal with the problem of noise in the output ground and supply lines are based on slowing the inherent switching speed of the output circuit. This however entails reducing the speed over the full range of production spreads and packaging types, slowing down the slowest circuits by a substantial multiple.

A different approach is taken in U.S. Pat. application Ser. No. 243,195 for DYNAMIC GROUND REFERENCE CHANGER FOR MULTIPLE STAGE INTEGRATED CIRCUITS filed Sept. 8, 1988. Output components on the quiet ground may be switched to the output ground following transition from high to low potential at the output. These components then follow changes in the reference voltages and maintain desired threshold differences during ground bounce and ground undershoot.

OBJECTS OF THE INVENTION

It is therefore an object of the present invention to provide new low noise circuits which substantially suppress, avoid or reduce the storage of parasitic tank circuit energy which causes ground bounce and $V_{cc}$ droop in the output stage without significant sacrifice in the speed of switching of the output stage.

Another object of the invention is to dissipate and dampen parasitic tank circuit energy that occurs in the output stage in the form of ground undershoot energy, $V_{cc}$ overshoot energy and subsequent ringing, without any loss in switching speed and with only minor transient sacrificial current and power dissipation.

A further object of the invention is to provide detectors for parasitic tank circuit energy in the output stage, whether manifested as ground bounce, ground undershoot, $V_{cc}$ droop, or $V_{cc}$ overshoot, providing transient detection and control signals for controlling and enhancing operation of the low noise circuits.

By these circuits and methods, the invention seeks to reduce transient voltages and transient noise inductively coupled into the internal quiet ground rails and supply rails, reduce RFI and EMI radiation and noise, improve dynamic thresholds, and reduce quiet output disturbances on a common bus for accurately transmitting and processing data signals of high and low potential.

DISCLOSURE OF THE INVENTION

In order to accomplish these results, the present invention provides a ground noise detector circuit for generating a transient ground noise signal (GNS) during transient occurrence of ground noise in the output ground PG relative to the quiet ground QG in excess of a selected threshold level. The ground noise detector circuit incorporates a ground noise detector transistor element with primary current path first and second nodes and a control node and associated control circuit or control path for controlling the conducting state of the primary current path. A power supply circuit is coupled to the first node, the control node is coupled to either the quiet ground or output ground, and the second node of the primary current path is coupled to the other of the quiet ground and output ground. A transient GNS is therefore generated at the first node during transient occurrence of ground potential variation when the differential between the quiet ground QG and output ground PG is in excess of the selected threshold level which causes transient change in the conducting state of the primary current path of the ground noise detector transistor element.

In the case of a ground bounce detector transistor element, the control node is coupled to output ground and the second node of the primary current path is coupled to the quiet ground for generating at the first node of the primary current path a transient ground bounce signal (GBS). In the case of a ground undershoot detector the control node is coupled to quiet ground and the second node of the primary current path is coupled to the output ground for generating at the first node of the primary current path a transient ground undershoot signal (GUS).

The ground bounce detector transistor element and the ground undershoot detector transistor element may be either an MOS transistor element such as, for example, an NMOS transistor element or a bipolar transistor element such as, for example an NPN transistor element.

The ground noise detector transistor element of either type may be coupled in a more complex circuit with one or more additional stages of current amplification either inverting or noninverting. For example the ground bounce detector circuit may incorporate a noninverting stage of current amplification for delivering a final transient GBS of low potential during transient occurrence of ground bounce of potential in excess of the threshold level in the output ground. By way of another example, the ground undershoot detector circuit may incorporate an inverting stage of current amplification for delivering a final transient GUS of high potential during transient occurrence of ground undershoot of potential in excess of the threshold level in the output ground.

Supply noise detector circuits are also provided for generating a transient supply noise signal (SNS) during transient occurrence of supply noise in the output $V_{cc}$ supply PV relative to the quiet $V_{cc}$ supply QV in excess of a selected threshold level. Similarly, the supply noise detector circuit incorporates a supply noise detector transistor element having primary current path first and second nodes and a control node for controlling the conducting state of the primary current path. A ground circuit is coupled to the second node, the control node is coupled to one of the quiet supply QV and output supply PV, and the first node of the primary current path is coupled to the other of the quiet supply QV and output supply PV. A transient SNS is therefore generated at the second node of the primary current path during transient occurrence of output supply variation in excess of a threshold differential. A differential between the quiet supply QV and output supply PV in excess of the selected threshold level causes transient change in the conducting state of the supply noise detector transistor element thereby generating the transient NS.

In the simplest case, the output noise detector circuit is implemented in MOS using a PMOS supply noise detector transistor element and in bipolar using a PNP transistor element. In the case of a $V_{cc}$ overshoot detector circuit, the control node is coupled to the quiet $V_{cc}$ supply QV and the first node of the primary current path is coupled to the output $V_{cc}$ supply PV for generating at the second node a transient $V_{cc}$ overshoot signal (VOS) during transient occurrence of $V_{cc}$ overshoot in the output supply PV in excess of the selected threshold level relative to the quiet supply QV. In the case of a $V_{cc}$ droop detector circuit, the control node is coupled to the output $V_{cc}$ supply PV and the first node of the primary current path is coupled to the quiet $V_c$ supply QV for generating at the second node a transient $V_{cc}$ droop signal (VDS) during transient occurrence of droop of potential in the output supply PV relative to the quiet supply QV in excess of the selected threshold level.

More generally it is seen that the invention provides a power rail noise detector circuit for an integrated circuit device having an input stage with ground and supply relatively quiet power rails and an output stage with switching output transistor elements. The output stage includes corresponding ground and supply output power rails characterized by lead inductance. The output power rails are subject to power rail noise upon switching of the output transistor elements.

The power rail noise detector circuit broadly conceived according to the invention is provided by a power rail voltage difference detector operatively coupled for detecting transient voltage difference in an output power rail relative to a corresponding quiet power rail upon switching of an output transistor element. The power rail voltage difference detector generates a transient power rail noise signal (PRNS) during occurrence of the transient voltage difference. The invention provides a substantial measure of the voltage drop across the output power rail lead inductance as a result of parasitic tank circuit energy. The power rail noise detector may therefore also be viewed as a voltage difference detector operatively coupled across power rail lead inductance for detecting transient voltage drop across the power rail lead inductance.

In the case of a ground bounce detector circuit the power rail voltage difference detector is coupled between the ground output power rail and ground quiet power rail for generating a ground bounce signal GBS. For a ground undershoot detector the coupling of the power rail voltage difference detector between the ground power rails is reversed for detecting undershoot of opposite polarity from bounce and generating a ground undershoot signal GUS.

In the case of a $V_{cc}$ droop detector circuit the power rail voltage difference detector is coupled between the supply output power rail and supply quiet power rail for detecting relative droop in supply voltage and generating a $V_{cc}$ droop signal VDS. For the $V_{cc}$ overshoot detector, the coupling of the power rail voltage difference detector between the supply power rails is reversed for detecting overshoot of opposite polarity from droop and generating a $V_{cc}$ overshoot signal VOS. Generally, the power rail voltage difference detector circuit is provided by a detector transistor element either MOS or bipolar which detects transient voltage differences between respective output and quiet power rails in excess of a threshold voltage level of for example 1 volt. In any event, the power rail noise detector is of similar form with variations in coupling according to its application in detecting bounce, droop, undershoot or overshoot.

The ground noise and supply noise detectors are then incorporated in a variety of the low noise circuits according to the invention for providing transient GBS, GUS, VDS and VOS signals for actuating or enhancing operation of the low noise circuits. Typically, the ground noise detector transistor or supply noise detector transistor are selected to turn on with a voltage differential threshold of 1 volt. Thus a voltage drop across the ground lead or supply lead parasitic inductance of greater than 1 volt initiates a detection signal. The detection signal actuates or enhances a low noise circuit for suppressing or dissipating parasitic tank circuit energy as hereafter described. As a result ground bounce and undershoot, $V_{cc}$ droop and overshoot can be limited to, for example the range of 1 to 1.5 volts.

For example, the anti-ground bounce circuit according to the invention incorporates a ground bounce detector circuit for generating a transient GBS. An anti-bounce transistor element is coupled with the primary current path first and second nodes in the control path or control circuit of the output pulldown transistor element. The anti-bounce transistor element constitutes a low resistance in its primary current path in the conducting state and a high resistance in the nonconducting state. The control node of the anti-bounce transistor element is coupled to the ground bounce detector circuit for transient increase of resistance in the control circuit of the output pulldown transistor element for the duration of the GBS from the ground bounce detector circuit. The transient suppression of turn on of the output pulldown transistor element thereby reduces ground bounce in the power ground.

An advantage of the transient suppression of turn on by the GBS and anti-bounce circuit of the invention is that it occurs after turn on of the pulldown transistor element has started. The anti-bounce circuit suppresses increase in conduction or turn on at whatever level ground bounce is detected. Pull down of voltage at the output therefore continues but at a suppressed level during occurrence of the ground bounce. A further advantage of the anti-bounce circuit of the invention is that the transient suppression lasts only zero to three nanoseconds as required, far less than the delay in conventional circuits which are directed to sowing the inherent switching speed of the output circuit.

The principal of operation of the invention in the antiground bounce circuit is as follows. As stated above, during transition from high to low potential at the output, the pulldown transistor element initially sinks the total amount of charge from the load capacitance and output capacitance $C_{out}$ to ground. The pulldown transistor element because of its low impedance only dissipates a fraction of the parasitic output tank circuit energy represented by this charge. The remainder parasitic tank circuit energy is stored in the ground lead inductance resulting in ground bounce. The antibounce circuit according to the invention suppresses and slows the turn on of the pulldown transistor element upon the detection of ground rise in potential. For example upon detection of ground noise in the form of a ground rise in potential of 1 volt or greater across the ground lead inductance, a ground bounce signal suppresses further turn on of the pulldown transistor element. The pulldown transistor element therefore operates at a lower level of conduction.

Parasitic tank circuit energy stored in the output capacitance is either dissipated in the output transistor or transferred and stored as parasitic tank circuit remainder energy in the ground lead inductance. An advantage of slowing down operation of the pulldown transistor at a lower conduction level is that a greater proportion of the parasitic tank circuit energy can be dissipated within the power dissipation limits of the output transistor. A greater proportion of the power transfer of parasitic tank circuit energy is therefore allocated to power dissipation in the output transistor rather than to storage of remainder energy in the parasitic lead inductance. The undesirable consequence and symptom of ground rise or ground bounce is therefore reduced.

Suppressing or slowing power transfer of parasitic tank circuit energy not only reduces the remainder energy stored in the parasitic lead inductance but also avoids peaks of current variation di/dt and therefore voltage drop across the lead inductance during a switching event. Turn on of the switching output transistor is suppressed to maintain voltage drop across the parasitic lead inductance below a specified level. For example, a voltage differential of 1 volt across the lead inductance is detected and the detection signal actuates the anti-noise circuit or anti-bounce circuit. The anti-noise circuit suppresses turn on of the output transistor. Voltage drop across the lead inductance, a symptom of the power transfer and storage of remainder energy in the lead inductance is limited to 1 volt or in the range of 1-1.5 volts. This contrasts with ground potential rise or ground bounce in the range of 2-2.5 volts and greater found in conventional high speed multi-stage integrated circuits.

The present invention thus maintains a low constant di/dt across the parasitic lead inductance and therefore a low constant voltage rise in the ground lead. To achieve this result there is a tradeoff between switching time and ground bounce. However because of the mode of operation of the invention in merely slowing and suppressing turn on of an output transistor rather than slowing the inherent switching speed of the output stage, the slow down in turn on of the output transistor is only in the order of 2 to 3 nanoseconds.

An anti-$V_{cc}$ droop circuit includes a $V_{cc}$ droop detector for generating a transient $V_{cc}$ droop signal VDS. An antidroop transistor element (ADT) is coupled with the primary current path first and second pins in the control path or control circuit of the output pullup transistor element. The anti-droop transistor element also presents a low resistance in its primary current path in the conducting state and a high resistance in the nonconducting state. The control node of the anti-droop transistor element is coupled to the $V_{cc}$ droop detector circuit for transient increase of resistance in the control circuit of the output pullup transistor element for the duration of a transient VDS. The transient suppression in turn on of the output pullup transistor element in the order of for example zero to 3 nanoseconds as required thereby reduces $V_{cc}$ droop in the output power supply PV. Analysis of the principle of operation of the anti-droop circuit according to the invention is similar to the principle of operation of the anti-bounce circuit set forth above. The functioning of the anti-droop circuit on the supply side is a "mirror image" of the functioning of the anti-bounce circuit on the ground side of the output stage.

The anti-ground bounce and anti-$V_{cc}$ droop circuits may be constructed with unipolar MOS transistors for example using an NMOS or PMOS transistor element for the anti-bounce transistor element and anti-droop transistor element. Alternatively, the circuits may be constructed from bipolar transistors using, for example NPN or PNP transistor elements for the anti-bounce transistor element and anti-droop transistor element. A feature of the combined circuit is that a single anti-noise transistor element (ANT) may be used for both the ABT and the ADT.

More generally it is seen that the invention provides a new anti-noise circuit for suppressing ground bounce and $V_{cc}$ droop in the power rails of an integrated circuit device having an input stage and an output stage. The input is characterized by relatively quiet power rails including ground and supply power rails. The output is characterized by switching output transistor elements and output power rails including ground and supply power rail. The output power rails are subject to noise upon switching of the output transistor elements.

The anti-noise circuit for suppressing bounce and droop includes a power rail noise detector for detecting transient voltages in a power rail upon switching of an output transistor element. The power rail noise detector generates a transient power rail noise signal (PRNS) during occurrence of transient voltage differences in an output power rail relative to a quiet power rail.

The anti-noise circuit for suppressing bounce and droop further includes a noise control circuit means operatively coupled to at least one output transistor element of the output stage and to the power rail noise detector circuit. The noise control circuit is constructed and arranged for transient suppression of turn on of the output transistor element. The transient slowing and suppressing of turn on of the output transistor element lasts for the duration of the transient PRNS. Since the power rails are characterized by power rail lead inductance, in the preferred example the power rail noise detector detects transient voltage drop across the power rail lead inductance. The transient PRNS is generated during the occurrence of such a transient voltage drop.

As heretofore described the power rail noise detector circuit may be a ground bounce detector for generating a transient ground bounce signal (GBS). The noise control circuit is provided by an anti-bounce transistor coupled to the control node of the pulldown transistor element. The GBS actuates the anti-bounce transistor for transient suppression of turn on of the pulldown transistor element during transient occurrence of ground bounce. Similarly the power rail noise detector may be an anti-droop detector generating a transient anti-droop signal (ADS). The noise control circuit is provided by an anti-droop transistor coupled to the control node of the pullup transistor element. The ADS actuates the anti-droop transistor for transient suppression of turn on of the pullup transistor element during transient occurrence of $V_{cc}$ droop in the supply power rail. A feature of the invention is that the same anti-noise transistor may be used for both the ground bounce transistor and anti-droop transistor for appropriately suppressing turn on of the pulldown transistor element and pullup transistor element respectively in response to GBS and ADS signals.

In a preferred embodiment of the invention the anti-ground bounce circuit is incorporated in a tristate output device with tristate control transistor elements (TCT's) including at least one TCT coupled in the control path circuit of the pulldown transistor element for disabling the pulldown transistor element in the high impedance third state. A feature of the invention is that one or more of the tristate TCT's are used for the anti-bounce transistor element (ABT). The control nodes of the TCT's are operatively coupled to the ground bounce detector circuit for transient suppression of turn on of the output pulldown transistor element during a transient GBS for reducing ground bounce in the power ground.

According to an additional feature of the anti-ground bounce circuit, logic condition transistor elements may be incorporated in the control path or control circuit of the anti-bounce transistor element ABT for controlling the conducting state of the ABT primary current path in response to the logic condition of the output stage. For example a data input condition transistor element may be incorporated in the control circuit of the ABT for conditioning control of the ABT by a GBS according to the data signal at the input of the output stage. For a tristate device an output enable condition transistor element may also be incorporated in the control circuit of the ABT for conditioning control of the ABT according to the state of the output enable signal.

The anti-undershoot circuit embodiments for single stage and multistage circuits incorporate an anti-undershoot circuit transistor element (AUCT) having the primary current path first and second nodes coupled in an anti-undershoot circuit between a current source such as output supply PV and output ground PG and through the output ground lead inductance to the external ground and output capacitance. An AUCT control circuit is arranged for establishing transient flow of a sacrificial current through the AUCT primary current path from a supply current source and through the output ground lead inductance to external ground following transition from high to low potential at the output. The AUCT parameters and dimensions are constructed to provide selected resistance in the primary current path in the conducting state for dissipating undershoot electrical energy stored in the output ground lead inductance thereby damping ground potential undershoot and subsequent ringing in the output ground.

The basic elements of the anti-undershoot circuit include an off chip current source for supplying the transient sacrificial current and a control circuit for initiating transient flow of the sacrificial current following transition from high to low potential at the output. The basic elements further include circuit coupling of the parasitic ground lead inductance in the sacrificial current path along with dissipating resistance. Parasitic tank circuit energy stored in the lead inductance is thereby dissipated in the dissipating resistance. This dissipating resistance is typically provided by the channel resistance of the anti-undershoot control transistor AUCT.

According to a first embodiment the AUCT control circuit comprises the undershoot detector circuit which generates a transient ground undershoot signal (GUS) during the transient occurrence of undershoot of potential in the output ground PG relative to the quiet ground QG in excess of the selected threshold level. The GUS is coupled to the AUCT control node for causing transient flow of sacrificial current through the resistance of the AUCT primary current path dissipating electrical energy stored in the output ground lead inductance during transient occurrence of ground undershoot.

In a second embodiment the anti-undershoot circuit incorporates an anti-undershoot control path resistor element (CPR) in the control circuit of the AUCT. The AUCT control circuit is in turn coupled to the control circuit of the pullup transistor element. As a result the AUCT operates substantially in parallel with the pullup transistor element but with transient delay in turn off of the AUCT introduced by the anti-undershoot control path resistor or resistance element CPR following transition from high to low potential at the output. The CPR can be provided by a resistor or, for example, by the resistance of an active transistor element such as the channel resistance of an MOS transistor. During the transient delay a transient sacrificial current flows through the primary current path resistance of the AUCT and the output ground lead inductance for dissipation of the inertial energy of the lead inductance.

In the various embodiments of the anti-undershoot circuit, the AUCT may be coupled at the second node of its primary current path either directly to output ground PG or through the output $V_{out}$ of the output stage to output ground PG. For example, the AUCT may be coupled in parallel with the pullup transistor element. The respective current path first nodes are coupled to the power supply current source, the respective primary current path second pins are coupled to the output of the output stage, and the control node of the AUCT is coupled to the control node of the pullup transistor element through the anti-undershoot control path resistance element CPR.

According to a third embodiment, elements of the first and second embodiments of the anti-undershoot circuit may be combined by incorporating an anti-undershoot switch transistor element (AUST) in the second embodiment. The primary current path first and second nodes of the AUST are coupled in series with the anti-undershoot control path resistor element CPR at the control node of the AUCT. An anti-undershoot detector circuit generates a transient GUS which is coupled to the control node of the AUST further retarding turn off of the AUCT following transition from high to low potential at the output. A feature of this arrangement is that the transient flow of sacrificial current through the resistance of the AUCT primary current path and output ground lead inductance is prolonged. This prolongation enables further dissipation of electrical energy from the output ground lead inductance for the duration of detected undershoot in the power ground as indicated by the GUS.

The various embodiments of the anti-undershoot circuit may incorporate a plurality of logic condition transistors operatively coupled for controlling the conducting state of the AUCT in accordance with the logic condition of the output stage. For example a data input condition transistor (ICT) and an output condition transistor (OCT) may be coupled with the respective primary current paths in series between the AUCT control node and output ground PG, either directly to the output ground PG or to output ground through the output $V_{out}$. The power supply current source is coupled to the AUCT control node through the AUCT control circuit which includes the control path resistor element CPR and anti-undershoot switch transistor AUST. The data input condition transistor ICT is controlled by the signal at the input of the output stage and the output condition transistor OCT is controlled by the signal at the output stage to permit turn on and transient conduction through the primary current path of the AUCT in association with a transition from high to low potential at the output. In this way the transient sacrificial current is established from the output supply current source PV through the AUCT primary current path resistance, output ground lead inductance, and output capacitance for dissipating inertial electrical energy of the lead inductance when the logic conditions are satisfied.

In addition to the logic condition transistors, the control circuit of the AUCT may include the anti-undershoot control path resistor, and an AUST coupled in series between the output supply current source and control node of the AUCT. The AUST primary current path first and second pins are coupled in series with the anti-undershoot control path resistor element CPR. An undershoot detector circuit generates a transient GUS during the transient occurrence of undershoot of potential in the output ground relative to the quiet ground in excess of the selected threshold level. The GUS is coupled to the control node of the AUST. All of the elements are constructed and arranged so that the antiundershoot circuit initiates transient sacrificial current flow through the AUCT during transition from high to low potential at the output when all logic conditions are satisfied. With all logic conditions satisfied, the antiundershoot circuit is operative for dissipating and damping undershoot energy in the resistance of the AUCT primary current path. The sacrificial current flow is further prolonged during detection of threshold undershoot for the duration of the GUS applied to the control node of the AUST, delaying turn off of the AUCT once the sacrificial current flow has been initiated.

According to a fourth embodiment of the anti-undershoot circuit, an anti-undershoot control resistor element CPR is coupled in the control circuit of the AUCT and the AUCT control circuit is coupled to the output through an output condition transistor OCT or an output condition network OCN. The output condition transistor or output network conditions and controls the conducting state of the AUCT in response to the data signal events at the output. The OCT and/or OCN can control turn on of the AUCT only when required for the sacrificial current and with a slow rise time to prevent transient interference in the output supply PV by the current requirements of the AUCT. The CPR resistor element retards turn off of the AUCT following transition from high to low potential at the output establishing the transient sacrificial current through the resistance of the AUCT. An AUST may also be incorporated in this output condition control pin circuit for the AUCT. As in the previous embodiments an undershoot detector circuit generates a transient GUS during occurrence of transient undershoot of potential. The GUS is coupled to the control node of the AUST for further retarding turn off of the transient flow of sacrificial current through the primary current path resistance of the AUCT for the duration of the GUS.

In the various embodiments, the low noise circuits may be implemented by either unipolar MOS transistor elements or bipolar transistor elements. In the case of NMOS transistor elements the first node of the primary current path corresponds to the drain, the second node to the source and the control node to the gate. In the case of bipolar NPN transistor elements the first node corresponds to the collector node, the second node to the emitter node, and the control node to the base node.

The invention also provides an anti-overshoot circuit for multi-stage circuits, with an anti-overshoot circuit transistor element (AOCT) coupled in an anti-overshoot circuit extending between the output $V_{cc}$ supply PV and ground and through the output supply PV lead inductance and output capacitance. An AOCT control circuit establishes transient flow of a sacrificial current through the AOCT primary current path resistance from the external $V_{cc}$ power supply and through the output supply PV lead inductance. The resistance of the AOCT primary current path dissipates inertial overshoot electrical energy stored in the output supply PV lead inductance thereby damping $V_{cc}$ overshoot and subsequent ringing in the output supply PV. The AOCT control circuit includes the overshoot detector circuit which generates a transient VOS for causing transient flow of sacrificial current through the AOCT primary current path resistance for the duration of the VOS.

A feature of the invention is that the same transistor element may serve as both the AOCT and the AUCT. Furthermore in the case of the AUCT, the transistor element may also serve as the ground undershoot detector simultaneously providing the GUS by coupling the control node of the AUCT to quiet ground QG and the second node of the primary current path to power ground PG.

More generally it is seen that the invention provides an anti-noise circuit for dissipating parasitic tank circuit energy causing ground undershoot and $V_{cc}$ overshoot in the power rails of an integrated circuit output stage with switching output transistor elements. The output power rails include ground and supply output power rails characterized by lead inductance. As result the power rails are subject to power rail noise upon switching of the output transistor elements.

The anti-noise circuit for dissipating parasitic tank circuit energy broadly includes a current source for sourcing a transient sacrificial current and a dissipating resistance. The anti-noise circuit couples the current source, dissipating resistance, and power rail lead inductance in a sacrificial current path. A control circuit initiates the transient sacrificial current flow in the sacrificial current path following switching of an output transistor for dissipating parasitic tank circuit energy.

In the case of an anti-undershoot circuit, the power rail of interest is the ground rail and the sacrificial current path and dissipating resistance are provided by the anti-undershoot circuit transistor element AUCT. In the case of an anti-overshoot circuit the power rail of interest is the supply rail and the transient sacrificial current path and dissipating resistance are provided by the anti-overshoot transistor element AOCT. Furthermore, the same transistor can serve as both the AUCT and AOCT. Finally, the control circuit can be one of a variety of circuits to initiate sacrificial current flow through the AUCT/AOCT in response to detection of transient undershoot or overshoot voltages, a switching event at the input of the output stage, a switching event at the output of the output stage, or a combination of these circuit events.

The invention also contemplates a variety of low noise circuits incorporating the ground noise detectors, supply noise detectors, anti-ground bounce circuits, anti-$V_{cc}$ droop circuits, anti-ground undershoot circuits, and anti-$V_{cc}$ overshoot circuits in any of a variety of permutations and combinations.

For example in a preferred combination, a low noise circuit for multi-stage circuits includes an anti-undershoot circuit transistor element (AUCT) in an anti-undershoot circuit defining the sacrificial current path from the output supply current source through the AUCT primary current path resistance, output ground lead inductance and output capacitance; an AUCT control circuit for establishing a transient sacrificial current in the anti-undershoot circuit following transition from high to low potential at the output; a ground bounce detector circuit for generating a transient GBS; an anti-bounce transistor element ABT coupled in the control path or control circuit of the output pulldown transistor element; and an ABT control circuit including the ground bounce detector circuit for transient delay in turn on of the output pulldown transistor element for the duration of the GBS.

The AUCT control circuit of the preferred combination low noise circuit incorporates a plurality of logic condition transistors for controlling the AUCT primary current path conducting state in response to the logic conditions at the input and output of the output stage. For example the logic condition transistors may include the data input condition transistor ICT1 data output condition transistor OCT, and an output enable condition transistor element (OECT1) in the case of tristate output devices. The AUCT control circuit also incorporates the anti-undershoot control path resistor element CPR delaying the turn off of the AUCT following transition from high to low potential at the output, and an AUST with ground undershoot detector circuit for generating a GUS to control the AUST and prolong the sacrificial current.

An advantage of conditioning operation of AUCT on the logic condition at the output as well as the logic condition at the input (of the output stage) is that the AUCT can be turned on only during the transition from high to low potential at the output rather than remaining on whenever the pullup transistor element is conducting. Furthermore the logic conditioning control with an OCT and output condition network OCN can assure a slow rise in the conduction through the AUCT from the power supply to avoid any further transient disruption or interference in the power supply potential.

The combined low noise circuits may also incorporate a plurality of logic condition transistors in the ABT control circuit including a data input condition transistor element ICT2 and an output enable condition transistor element OECT2 in the case of tristate output devices. In the preferred combination low noise circuit for tristate output devices the tristate control transistor elements (TCT's) which disable the pulldown transistor element during the tristate condition are used for the ABT transistor element for retarding or suppressing turn on of the pulldown transistor element for the duration of a GBS.

Other objects, features and advantages of the invention are apparent in the following specification and accompanying drawings.

BRIEF DESCRIPTION OF THE DRAWINGS

FIG. 3 is a fragmentary schematic diagram of a portion of the prior art multi-stage circuit implemented with bipolar NPN transistors.

FIG. 4 is a graph showing the potential in the output ground PG during the transient ground bounce and ground undershoot events and subsequent ringing.

FIG. 5 is a graph of the potential in the output supply PV during the transient $V_{cc}$ droop and overshoot events and subsequent ringing.

FIG. 6 is a schematic diagram of a ground bounce detector circuit implemented in MOS delivering a GBS of low potential during a transient ground bounce event.

FIG. 6A is a schematic diagram of a ground bounce detector circuit implemented in bipolar for delivering a GBS of low potential during a transient ground bounce event.

FIG. 7 is an MOS ground bounce detector circuit building upon the circuit of FIG. 6 with an additional noninverting stage of current amplification.

FIG. 7A is a schematic diagram of an inverting stage for generating a GBS of high potential and FIG. 7B is a detailed schematic diagram showing the MOS implementation of the inverting stage.

FIG. 8 is a schematic diagram of a bipolar ground bounce detector circuit building on the circuit of FIG. 6A with an additional inverting stage of current amplification generating a GBS of high potential.

FIG. 16 is a detailed fragmentary schematic diagram of the control circuit at the pulldown transistor element for an anti-ground bounce circuit similar to FIG. 15 but incorporating a PMOS pulldown transistor element.

FIG. 17 is a schematic diagram of an MOS anti-$V_{cc}$ droop circuit for the output stage.

FIG. 18 is a schematic diagram of the first embodiment of the anti-undershoot circuit for the output ground of the output stage implemented in MOS showing some equivalent circuit elements and which circuit configuration can also be used for a $V_{cc}$ anti-overshoot circuit.

DESCRIPTION OF PREFERRED EXAMPLE EMBODIMENTS AND BEST MODE OF THE INVENTION

A simple ground bounce detector circuit GBD implemented by an NMOS GBD transistor element N3 is illustrated in FIG. 6. The power supply $V_{cc}$ is coupled to the first node of the primary current path of transistor N3 through drain resistor $R^d$. The relatively noisy output ground PG is coupled to the gate node. The relatively quiet input ground QG is coupled to the second node of the primary current path of transistor N3. As a result, a transient ground bounce signal GBS of low potential appears at the output of the GBD during a ground bounce event in which the differential between PG and QG exceeds the turn on threshold for transistor N3. This is typically selected according to the invention to be in the order of 1 volt. The output of the GBD is taken from the first node at the drain of transistor N3.

The same circuit implemented in bipolar technology is illustrated in FIG. 6A using NPN GBD transistor element Q6 in place of NMOS transistor N3. The collector, base and emitter nodes of transistor Q6 correspond respectively with the drain, gate and source nodes of transistor N3. While the first and second nodes of the primary current path of transistor N3 are at the drain and source, the first and second nodes of the primary current path for transistor Q6 are at the collector and emitter.

A GBD circuit based upon the basic circuit of FIG. 6 but providing two stages of current amplification of the ground bounce signal GBS is illustrated in FIG. 7. The basic ground bounce detector transistor element and first stage of current amplification is provided by NMOS transistor N3 in combination with the complementary PMOS transistor P3. When transistor N3 is conducting during a ground bounce event, complementary transistor P3 is nonconducting and acts as a high resistance. The NMOS transistor pair N4, N5 provides a noninverting stage of current amplification for the final GBS of low potential. According to circuit requirements a GBS of high potential is provided by including or adding an inverting stage 40 of current amplification in the GBD circuit as illustrated in FIG. 7A. The standard MOS inverting stage of current amplification is provided by the complementary pair of NMOS and PMOS transistors N6 and P6 as illustrated in FIG. 7B.

A GBD circuit implemented in bipolar technology based on the circuit of 6a but with two stages of current amplification as illustrated in FIG. 8. NPN transistor Q7 provides the second stage of current amplification with inversion so that the final transient GBS signal appearing at the output during a transient ground bounce event is of high potential.

Figure 9:
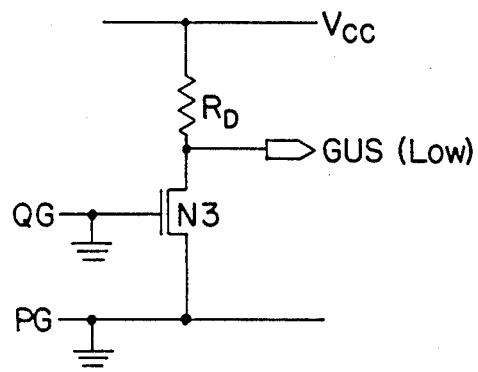
FIG. 9 is a schematic diagram of a ground undershoot detector circuit implemented in MOS generating a GUS of low potential during a transient ground undershoot event.
Figure 9A:
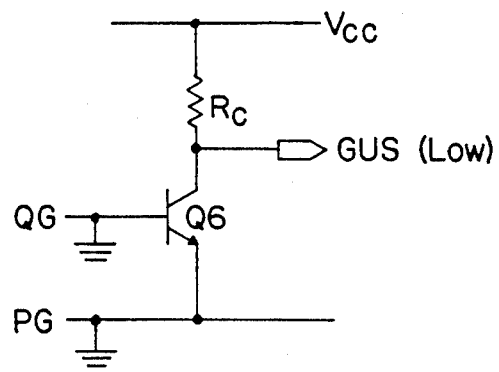
FIG. 9A is a schematic diagram of a ground undershoot detector circuit implemented in bipolar for delivering a GUS of low potential during a transient ground undershoot event.

A basic circuit for detecting the ground undershoot which may follow the ground bounce is illustrated in FIG. 9. The basic ground undershoot detector circuit GUD is the same as the GBD circuit of FIG. 6 except that the coupling of the output ground PG and quiet ground QG is reversed. QG is coupled to the gate node of GBD transistor element N3 while PG is coupled to the source at the second node of the primary current path through transistor N3. The bipolar implementation of the basic GUD circuit illustrated in FIG. 9a is also the same as the bipolar GBD circuit of FIG. 6a with the coupling of PG and QG reversed. The GUD circuits of FIGS. 9 and 9A deliver a transient ground undershoot signal GUS of low potential during a ground undershoot event. Thus, according to these GUD circuit configurations, the output from the GUD circuit is normally high, going low only during the transient ground undershoot event.

Figure 10:
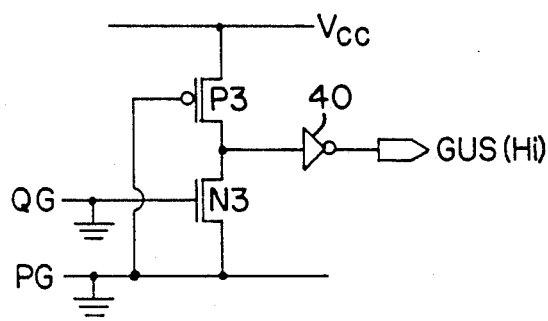
FIG. 10 is a schematic diagram of an MOS ground undershoot detector circuit building on the circuit of FIG. 9 with an additional inverting stage of current amplification for delivering a GUS of high potential.
Figure 11:
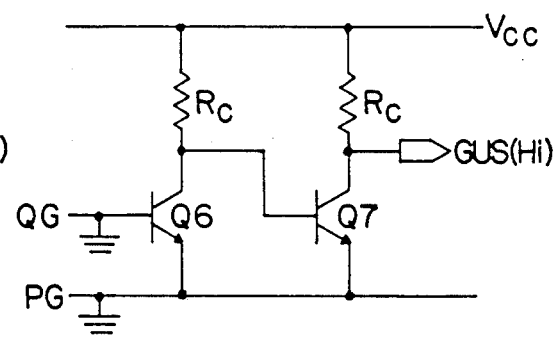
FIG. 11 is a schematic diagram of a bipolar ground undershoot detector circuit building on the circuit of FIG. 9A with an inverting stage of current amplification for delivering a GUS of high potential.

A GUD circuit with two stages of current amplification and inversion is illustrated in FIG. 10. A ground undershoot event in excess of the threshold detection level is detected by the GUD transistor element N3 which is combined with complementary PMOS transistor P3. Transistor P3 is normally conducting and the output of the first stage N3, P3 is normally high except during transient occurrence of a ground undershoot event when the output of the first stage is at low potential. A second inverting stage 40 as illustrated for example in FIG. 7B is added so that the final ground undershoot signal output GUS is high during a ground undershoot event. The bipolar implementation of this GUD circuit with two stages of current amplification and with inversion of the GUS is illustrated in FIG. 11. This circuit is the same as the GBD circuit of FIG. 8 but with the coupling of PG and QG reversed.

Figure 12:
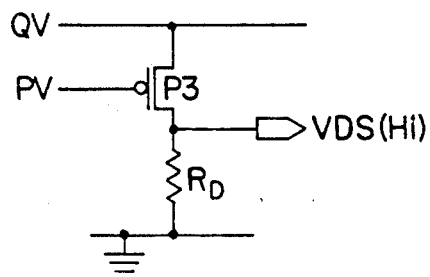
FIG. 12 is a schematic diagram of a $V_{cc}$ droop detector circuit implemented in MOS delivering a $V_{cc}$ droop signal (VDS) of high potential during a transient $V_{cc}$ droop event and FIG. 12A is a schematic diagram of the $V_{cc}$ droop detector circuit implemented in bipolar technology.
Figure 12A:
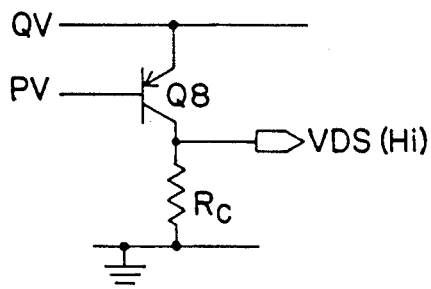

The correlate of ground bounce in the supply rail is $V_{cc}$ droop in the output supply rail or PV droop and the basic PV droop detector circuit is illustrated in FIG. 12. The PV droop detector transistor element P3 is coupled with a ground circuit at the second node of the primary current path which in the PMOS transistor corresponds to the drain node. The relatively noisy output supply line PV is coupled to the gate node of transistor P3 while the relatively quiet input supply line QV is coupled to the first node of the primary current path which corresponds to the source node of PMOS transistor P3. The output taken from the second node or drain of transistor P3 is normally at low potential and a PV droop signal VDS of high potential appears at the output during a PV droop event. Additional stages of current amplification with or without inversion may be included to provide a VDS of either high or low potential according to circuit requirements. A bipolar implementation of the basic PV droop detector circuit of FIG. 12 is illustrated in FIG. 12a using PNP transistor Q8. Additional stages of current amplification with or without inversion may also be added.

Figure 13:
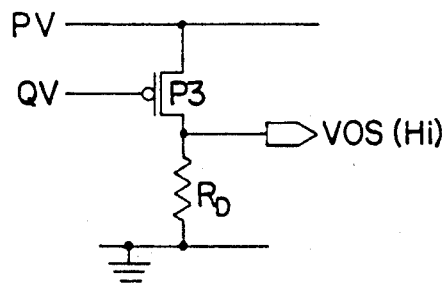
FIG. 13 is a schematic diagram of a $V_{cc}$ overshoot detector circuit implemented in MOS delivering a $V_{cc}$ overshoot signal (VOS) of high potential during a transient $V_{cc}$ overshoot event and FIG. 13A is a schematic diagram of the $V_{cc}$ overshoot detector circuit implemented in bipolar technology.
Figure 13A:
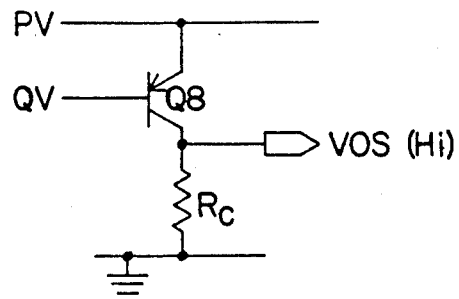

The correlate of ground undershoot is $V_{cc}$ overshoot in the output supply rail or PV overshoot and a basic PV overshoot detector circuit is illustrated in FIG. 13. The PV overshoot detector circuit is the same as the PV droop detector circuit of FIG. 12 except that the coupling of PV and QV are reversed. A PV overshoot signal VOS of high potential appears at the output during a PV overshoot event in excess of the differential threshold which causes turn on of the PV overshoot detector transistor element P3. The bipolar implementation of the basic PV overshoot detector circuit is illustrated in FIG. 13a using PNP transistor element Q8.

Figures 1, 1A:
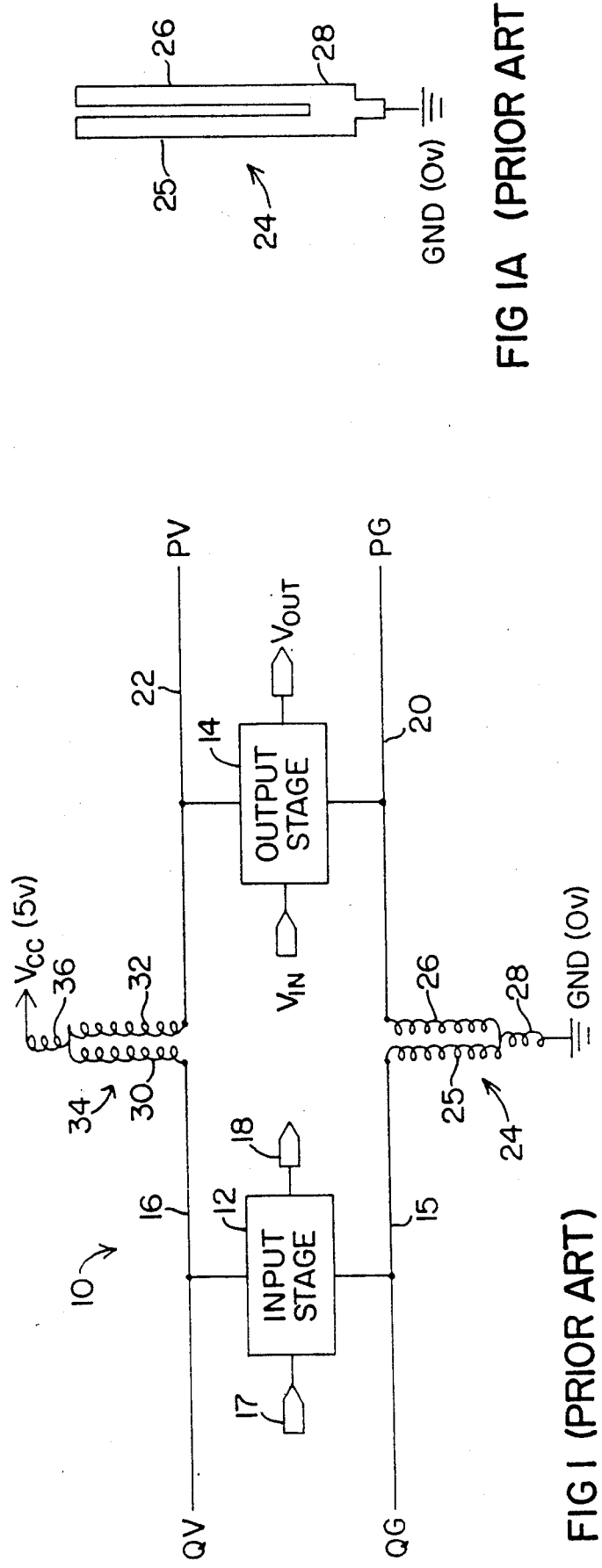
FIG. 1 is a fragmentary schematic and block diagram of a prior art multi-stage integrated circuit with input stage and output stage relatively isolated by split leads for the respective ground lines and supply lines.
FIG. 1A is a detailed diagrammatic plan view of an integrated circuit split lead for relatively isolating the output ground PG and quiet ground QG.
Figure 2:
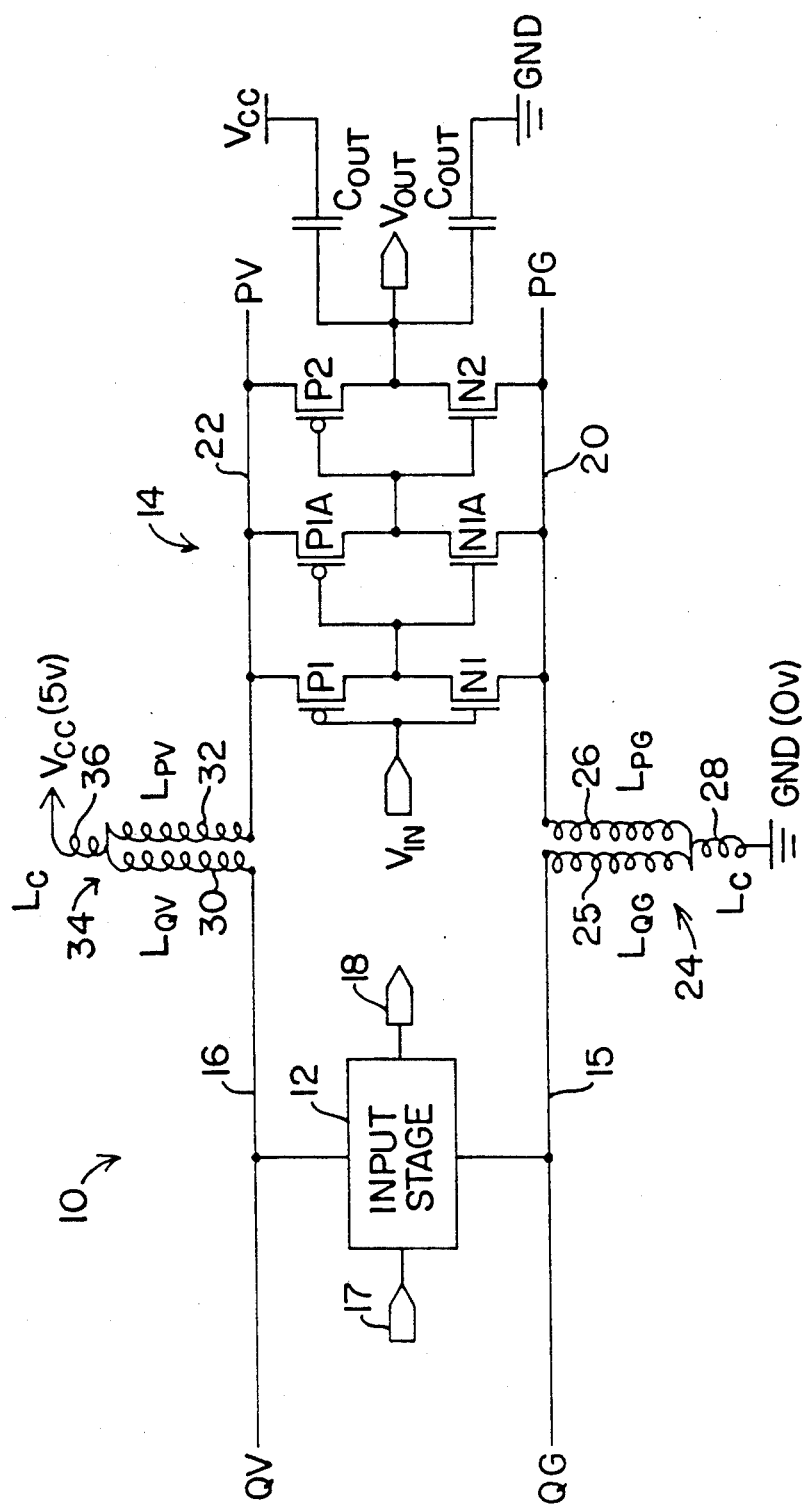
FIG. 2 is a fragmentary schematic and block diagram of the prior art multi-stage circuit implemented by MOS transistors.
Figure 14:
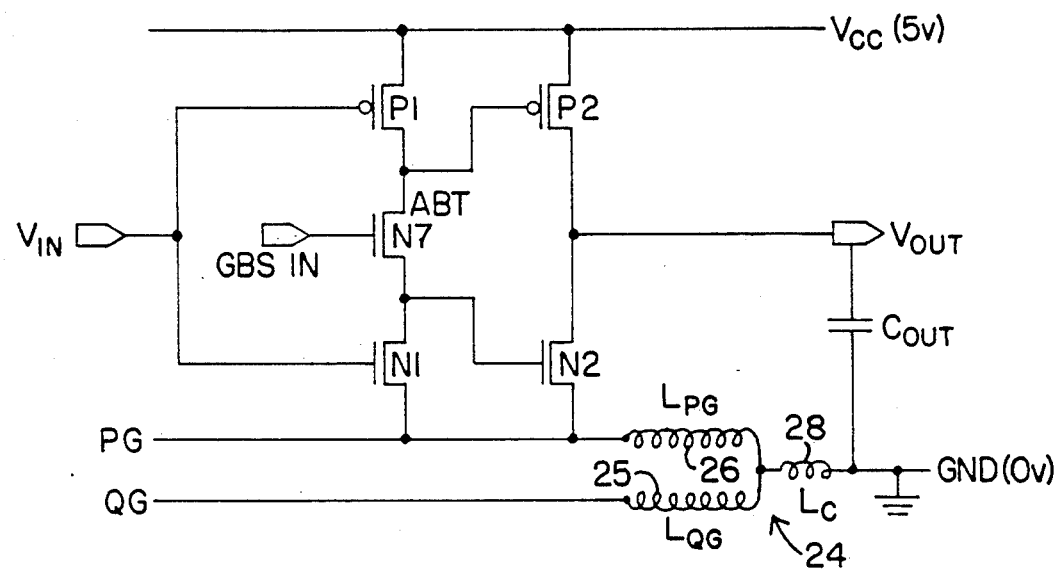
FIG. 14 is a schematic diagram of an MOS anti-ground bounce circuit for the output stage, which circuit configuration can also be used for an anti-$V_{cc}$ droop circuit

An anti-ground bounce circuit or anti-bounce circuit for eliminating or reducing ground bounce at an MOS output stage is illustrated in FIG. 14. In this example the output circuit includes two stages of current amplification and circuit elements corresponding to the output stage elements of FIG. 1 and 2 are indicated by the same designations. To the basic output stage is added an anti-bounce transistor element N7. The ABT N7 is coupled with its primary current path between the complementary NMOS and PMOS transistors N1, P1 of the first stage of current amplification. In particular the first node or drain node of transistor N7 is connected to the drain of transistor P1. The second node or source node of transistor N7 is connected to the drain node of transistor N1. Furthermore, the drain and source nodes of ABT transistor N7 are coupled respectively to the gate nodes of transistors P2, N2 of the second stage of current amplification. The gate of ABT transistor N7 is connected to receive the ground bounce signal GBS from a GBD circuit such as the circuit of FIG. 7.

As a result with the GBS normally high, the anti-bounce transistor N7 is normally conducting. With its low resistance in the conducting state transistor N7 is then a transparent element in the circuit and does not interfere in the operation of the output gate.

Figure 15:
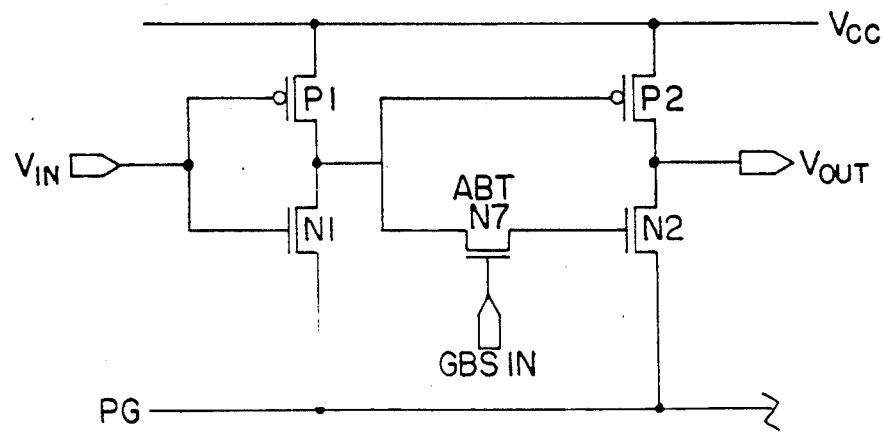
FIG. 15 is a schematic diagram of an alternative configuration of the MOS anti-ground bounce circuit.

During transition from high to low potential at the output $V_{out}$, pulldown transistor element N2 turns on and the surge of current may produce a ground bounce event in the output ground PG. Upon detection of a ground bounce event the ground bounce GBS goes low turning off the anti-bounce transistor N7. Transistor N7 then becomes a high resistance in the control circuit or gate circuit of the pulldown transistor element N2 suppressing further turn on of the pulldown transistor element N2 for the duration of a low level GBS at the gate of anti-bounce transistor N7. Ground bounce energy is therefore rapidly dissipated without further buildup. This suppression of further turn on of the pulldown transistor element N2 has a duration no more than for example 1-3 ns. Preferably the anti-bounce transistor element N7 is placed directly in the control circuit at the gate of pulldown transistor element N2 as illustrated in FIG. 15. This arrangement provides more effective control over the charging of the gate of pulldown transistor element N2.

While the pulldown transistor element N2 of the circuit of FIG. 14 and 15 is an NMOS transistor element, the antibounce transistor element N7 is equally effective in providing an anti-bounce circuit for an output stage having a PMOS pulldown transistor P4 as illustrated in FIG. 16. The anti-bounce transistor element N7 is similarly coupled in the control circuit at the gate node of pulldown transistor P4. During transient duration of a GBS of low potential the ABT transistor N7 in the nonconducting state constitutes a high resistance which suppresses discharge of the gate and therefore turn on of transistor P4. The transient suppression of turn on of the pulldown transistor element again faithfully follows the detection of ground bounce therefore suppressing the ground bounce and all within a range of duration of for example no more than 1-3 ns.

The basic circuit of FIG. 14 may also be implemented as an anti-droop circuit with transistor N7 operating as an anti-PV droop transistor element. According to this application the gate of the anti-PV droop transistor element N7 is coupled to receive a PV droop detection signal VDS such as provided by the droop detector circuit of FIG. 12 but with an additional inverting stage of current amplification providing a VDS signal of low potential.

During transition from low to high at the output $V_{out}$ the pullup transistor P2 turns on and the surge of current from the output power ground line PV may cause a PV droop event. As a result a VDS signal of low potential at the gate of transistor N7 causes transistor N7 to turn off during the transient duration of the VDS. The high resistance of anti-PV droop transistor N7 in the nonconducting state prevents further discharge of the gate of pullup transistor element P2 and therefore suppresses further turn on of this PMOS transistor. As a result the PV droop is suppressed and rapidly dissipated with a suppression duration of turn on of the pullup transistor element in the range of only 1 to 3 NS.

According to a preferred embodiment the anti-droop transistor element ADT such as an NMOS transistor N8 is coupled directly in the control circuit at the gate of pullup transistor P2 for more effective control over the discharge of the gate as illustrated in FIG. 17. As previously described the gate of ADT transistor N8 is coupled to receive the PV droop signal VDS from a droop detector circuit that delivers a transient VDS signal level of low potential during transient occurrence of a droop event in the output power rail.

An anti-undershoot circuit for rapidly dissipating ground undershoot energy is illustrated in FIG. 18. In this first anti-undershoot circuit embodiment an anti-undershoot circuit transistor element AUCT1 is coupled with its primary current path between the output supply $V_{cc}$ and output ground PG and through the PG lead inductance to the external ground and output capacitance. In the example of FIG. 18 the AUCT1 is an NMOS transistor and the gate is coupled to receive a ground undershoot signal GUS of high potential during transient occurrence of an undershoot event in the output ground PG. By way of example, the gate node of anti-undershoot NMOS transistor AUCT1 may be coupled to a GUD circuit such as that illustrated in FIG. 10. Alternatively, the anti-undershoot circuit transistor AUCT1 may also function as the ground undershoot detector transistor element by connecting the gate of AUCT1 to the relatively quiet input ground QG as shown by the broken line 45 in FIG. 18.

During transient occurrence of the ground undershoot event and GUS signal of high potential the anti-undershoot circuit transistor conducts through its primary current path a sacrificial current for dissipating ground undershoot energy stored in the output ground lead inductances $L_{pg}$, $L_c$ etc. The ground undershoot energy is dissipated in the channel resistance of AUCT1. To this end the channel width and channel resistance of the NMOS transistor AUCT1 may be selected to afford critical damping of energy stored in the output "tank circuit" which includes the PG lead inductance $L_{pg}$ and $L_c$ and the output capacitance $C_{out}$.

Figure 19:
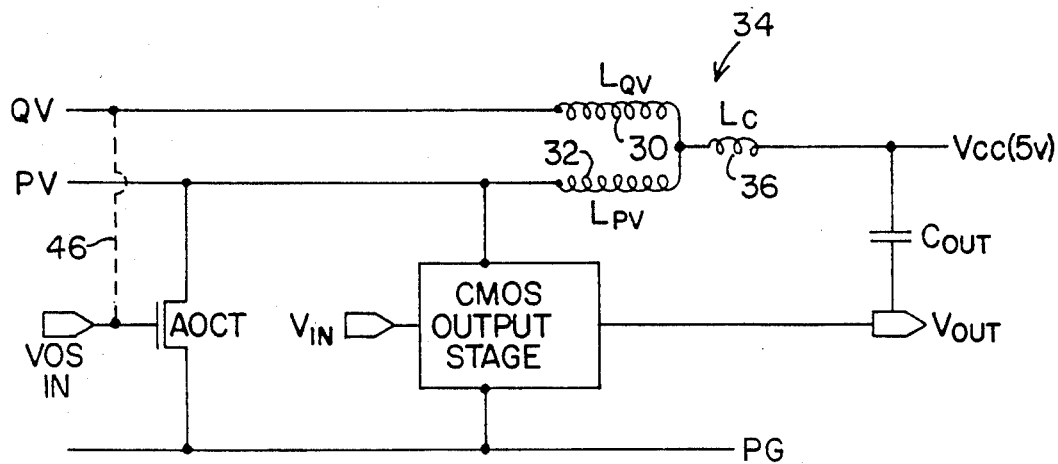
FIG. 19 is a schematic and block diagram of an anti-overshoot circuit for the output supply PV of the output stage implemented in MOS and showing some of the equivalent circuit elements.

The NMOS transistor AUCT 1 is capable of functioning not only as an anti-undershoot circuit transistor and as its own ground undershoot detector transistor element, but it is also capable of functioning as an anti-overshoot circuit transistor for dissipating overshoot energy in the output supply rail PV as illustrated in FIG. 19. In FIG. 19 the NMOS transistor AOCT is coupled with its primary current path between the relatively noisy output supply line PV and one of the ground circuits. The gate of NMOS transistor AOCT is coupled to receive a PV overshoot signal VOS of high potential during transient occurrence of an overshoot event in the output supply line PV. The VOS may be generated by a separate PV overshoot detector circuit such as for example illustrated in FIG. 13. Alternatively, the anti-overshoot circuit transistor AOCT may function as its own PV overshoot detector transistor element by coupling the gate node to the relatively quiet input supply rail QV as shown by broken line 46 in FIG. 19.

Upon occurrence of a PV overshoot event during transition from low to high potential at the output $V_{out}$, a VOS of high potential causes a transient flow of sacrificial current from the output supply line PV to ground and through the PV supply lead inductance $L_{pv}$, $L_c$ etc. for dissipation of the overshoot energy. Overshoot energy is dissipated in the channel resistance of anti-overshoot circuit transistor element AOCT. The channel width and resistance of transistor AOCT may be selected for critical damping of overshoot energy stored in the output supply tank circuit including PV lead inductances, $L_{pv}$ and $L_c$ and the output capacitance $C_{out}$. By way of example the channel width of the anti-undershoot or anti-overshoot circuit transistor may be selected in the order of for example 240 microns in contrast with the channel width size of typical MOS pullup and pulldown transistor elements of for example 1800 microns for substantially equal channel lengths.

It is apparent that FIGS. 18 and 19 may be combined with parallel transistors such as NMOS transistors performing the functions of anti-undershoot circuit transistor AUCT1 and ground undershoot detector transistor element, and antiovershoot circuit transistor AOCT and PV overshoot detector transistor element. With the broken line detector couplings 45 and 46 as illustrated in FIGS. 18 and 19 no additional GUD circuit or PV overshoot detector circuit is required.

Figure 20:
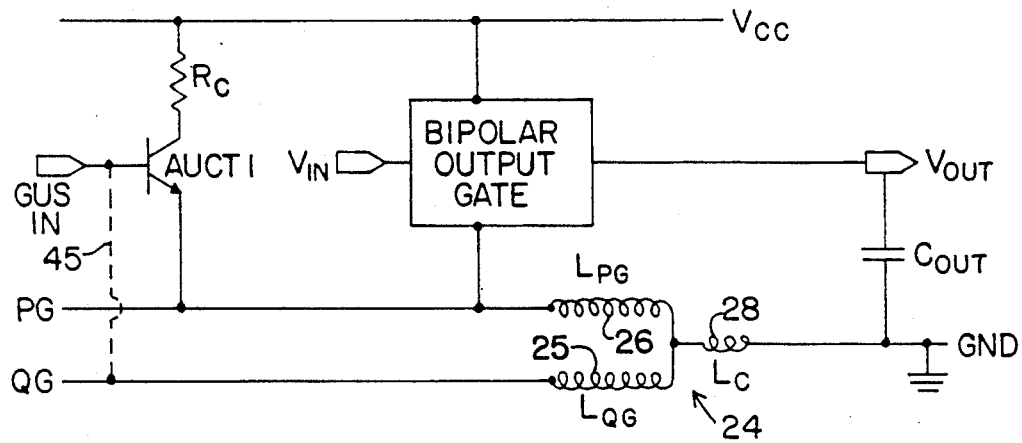
FIG. 20 is a schematic and block diagram of an anti-undershoot circuit similar to the circuit of FIG. 19 but implemented in bipolar and also showing some of the equivalent circuit elements.

A bipolar implementation of the anti-undershoot circuit of FIG. 18 is illustrated in FIG. 20. The anti-overshoot circuit of FIG. 19 may similarly be implemented in bipolar technology using, for example an NPN transistor in a similar manner for the AUCT1 and the AOCT.

Figure 21:
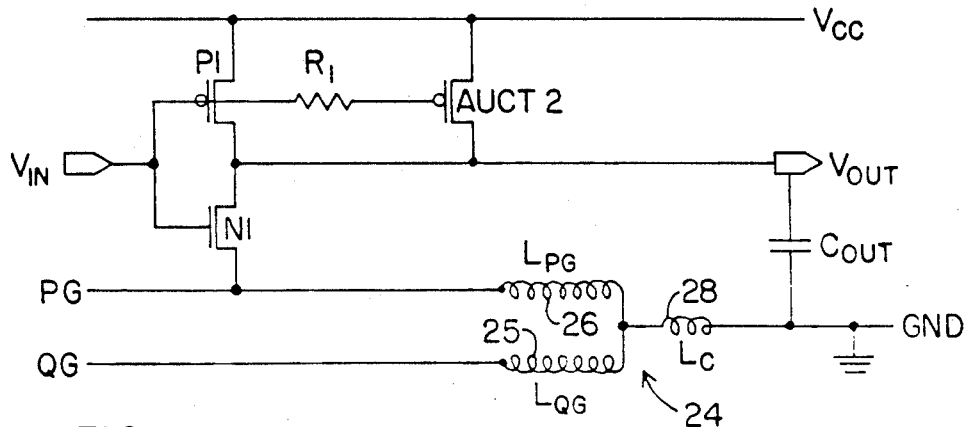
FIG. 21 is a schematic diagram of the second embodiment of the anti-undershoot circuit for the output ground PG of the output stage implemented in MOS and showing some of the equivalent circuit elements.

A second embodiment of the anti-undershoot circuit, illustrated in FIG. 21 incorporates a PMOS anti-undershoot circuit transistor AUCT 2 in parallel with the pullup transistor element P1 of an output stage. The first nodes of the respective primary current paths at the sources of P1 and AUCT 2 are coupled to the outlet supply while the second nodes of the respective primary current paths at the drains are connected to the output $V_{out}$ and through the output circuit to output ground when the output $V_{out}$ is at low potential. A control path resistor element R1, also referred to as a control path resistance CPR is coupled to the gate of AUCT2 in series between the input $V_{in}$ and the control node of AUCT2. As a result AUCT2 operates substantially in parallel with the pullup transistor element P1 but with transient delay in turn off of AUCT2 introduced by the AUCT2 control path resistor R1. It is noted that the CPR can be provided by either a passive resistor element or the resistance of an active transistor element.

Following transition from high to low potential at the output $V_{out}$ and turn off of the pullup transistor P1, there is transient delay in the turn off of AUCT2 permitting a transient sacrificial current flow through the primary current path of AUCT2 and the power ground lead inductance $L_{pg}$, $L_c$ for dissipation of undershoot energy stored in the parasitic tank circuit at the output. Again the channel resistance of transistor AUCT2 provides the dissipating resistance which dissipates the undershoot energy and the channel width and channel resistance may be selected to achieve a desired critical damping.

Figure 22:
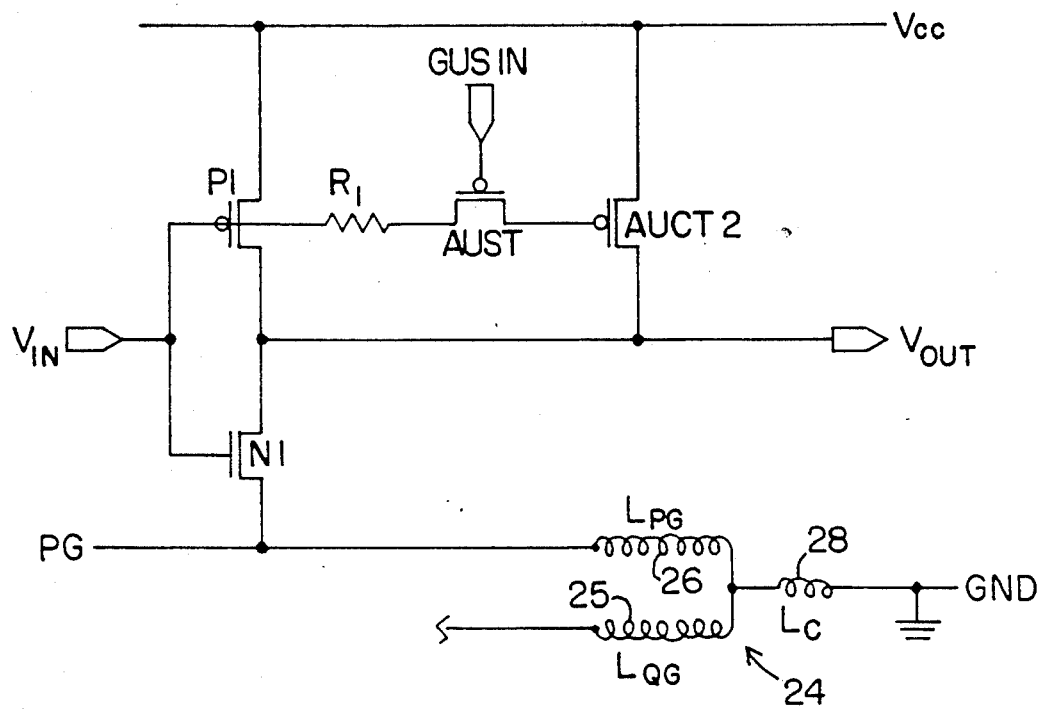
FIG. 22 is a schematic diagram of the third embodiment of the anti-undershoot circuit implemented in MOS and showing some of the equivalent circuit elements.

A third embodiment of the anti-undershoot circuit is illustrated in FIG. 22 incorporating an anti-undershoot switch transistor AUST in series with the control path resistor element R1 in the control circuit of anti-undershoot circuit transistor AUCT2. In this example the anti-undershoot switch transistor AUST is also a PMOS transistor and the gate node is coupled to receive a ground undershoot signal GUS from a GUD circuit such as the circuit of FIG. 10. Thus transistor AUST is normally conducting forming a low resistance in series with the CPR resistor R1. During transition from high to low potential at the output, the transient delay in turn off of AUCT2 permits transient flow of the sacrificial current. This delay in turn off is due to the resistance to the flow of discharge current out of the gate of AUCT2. If ground undershoot is detected resulting in a GUS of high potential there is transient turn off of the anti-undershoot switch transistor AUST thereby increasing resistance to the discharge current flow from the gate of AUCT2 further retarding turn off of AUCT2. The detection of ground undershoot therefore prolongs the sacrificial current flow through the primary current path of transistor AUCT2, further dissipating ground undershoot energy stored in the parasitic output tank circuit for the duration of the GUS.

Figure 23:
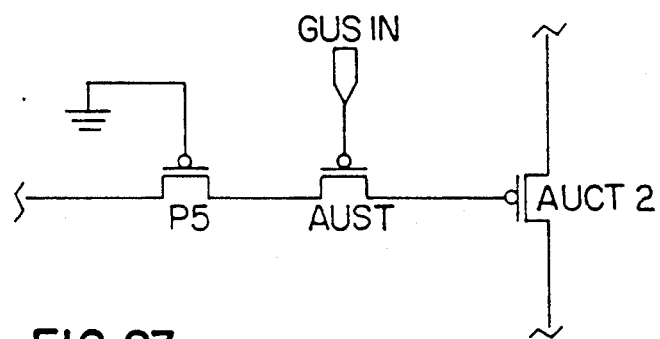
FIG. 23 is a detailed fragmentary schematic diagram of the AUCT control circuit for the circuit of FIG. 22.

As shown in the detail of the control circuit of AUCT2 illustrated in FIG. 23, the control path resistance or CPR may be implemented by, for example, a PMOS transistor P5 with gate tied to ground. The channel width structure of PMOS transistor P5 is selected to provide the desired resistance in the control pin circuit of AUCT2. Alternatively, a diffused or implanted resistor can be used. The AUST which is normally conducting may also be viewed as a switch which opens for a period of transient duration introducing a further high resistance during transient occurrence of a GUS.

Figure 24:
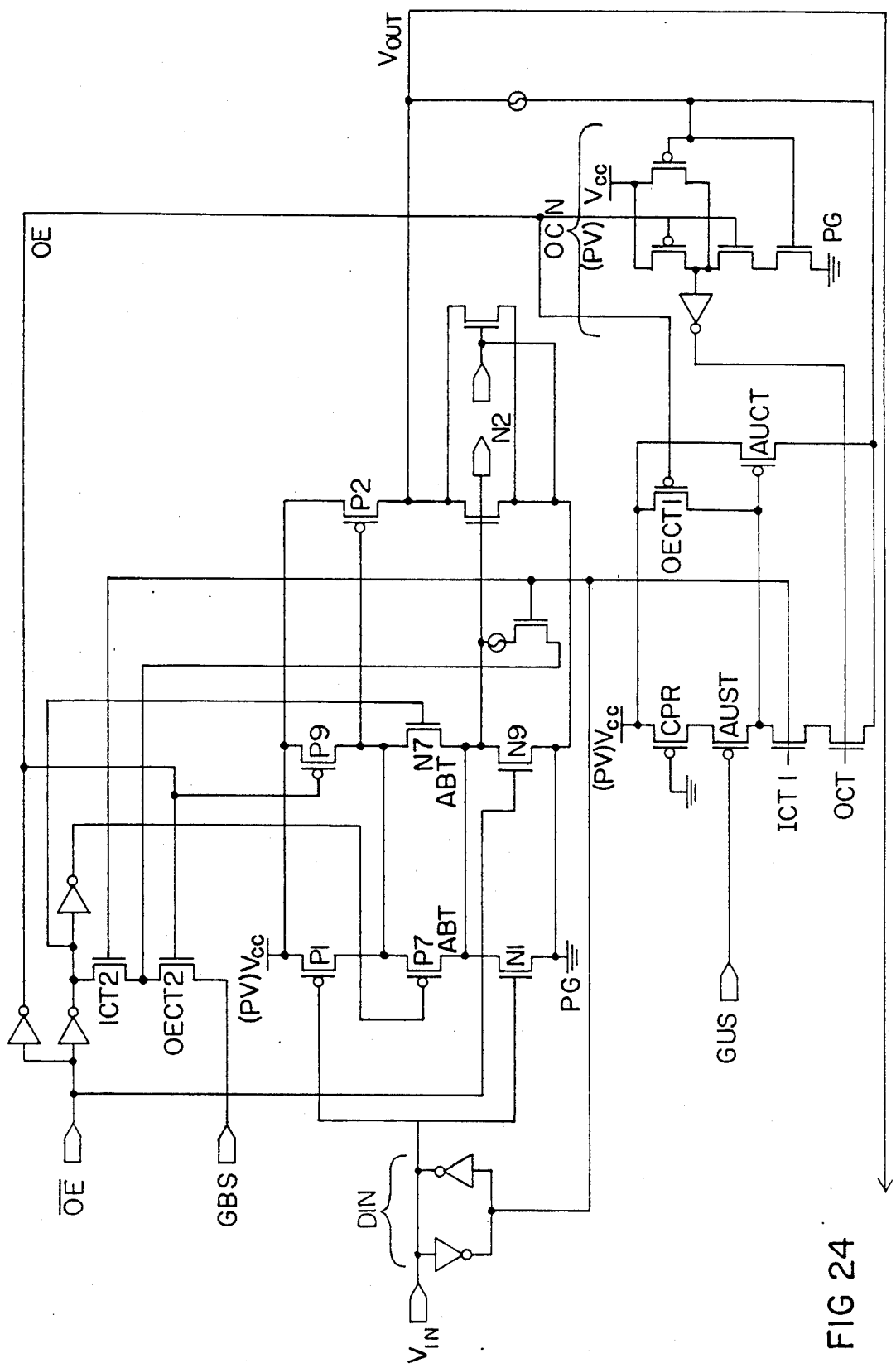
FIG. 24 is a detailed schematic diagram of a combined low noise circuit according to the invention incorporating both an anti-ground bounce circuit and an anti-ground undershoot circuit and further incorporating logic condition transistor elements controlling the operation of the anti-ground bounce and anti-undershoot circuits.

A combined low noise circuit incorporated in a tristate output stage of, for example, an octal buffer line driver is illustrated in FIG. 24. This tristate output buffer incorporates both an anti-bounce circuit for suppressing ground bounce and an anti-undershoot circuit for rapidly dissipating ground undershoot energy. The tristate output buffer of FIG. 24 is noninverting so that a high potential level signal appears at the output $V_{out}$ when a high level signal is applied at the input $V_{in}$. This is accomplished by two stages of current amplification with inversion, the first stage including the complementary pair of MOS transistors P1 and N1 and a second stage which includes the output pullup transistor element P2 and pulldown transistor element N2. The pulldown transistor N2 is shown in a form which permits user selection of the size of transistor N2.

The anti-undershoot circuit incorporates a PMOS anti-undershoot circuit transistor AUCT with its primary current path operatively coupled between the output supply PV and through the output $V_{out}$ to the output ground PG for establishing transient sacrificial current flow following transition from high to low potential at the output $V_{out}$. The channel width of the AUCT, for example 240 microns, is selected to provide the desired resistance for critically damping and rapidly dissipating ground undershoot energy. The AUCT is normally not conducting because its PMOS gate is supplied with charge by the output supply PV through the AUCT control path resistance CPR and the anti-undershoot switch transistor AUST. In this example the CPR is provided by a gate grounded PMOS transistor with small channel width of for example 14 microns and length of 21 microns providing the desired resistance to current during discharge of the gate of the AUCT.

The anti-undershoot switch transistor AUST is normally conducting with its gate coupled to a GUD circuit such as the circuit of FIG. 10 which provides a ground undershoot signal GUS normally at low potential in the absence of detected ground undershoot. A transient GUS of high potential is provided during occurrence and detection of ground undershoot in excess of the threshold differential of the GUD circuit.

The gate of the AUCT is also coupled to ground via the output $V_{out}$ by two logic condition transistors, a data input condition transistor ICT1 and a data output condition transistor OCT. As long as either of the NMOS transistors ICT1 and OCT is off, the charge at the gate of the AUCT cannot escape and the AUCT remains nonconducting.

During normal operation of the tristate output buffer in the bistate mode, enabled by a high level OE signal, and with a high level data signal at the output $V_{out}$, the output condition network OCN delivers a high level signal charging the gate of NMOS output transistor OCT. The OCT is therefore already conducting. Upon receipt of a low level data signal at the input $V_{in}$, the inverting data enable network or data input network DIN charges the gate of input condition transistor ICT1 so that ICT1 also becomes conducting. During the transition of $V_{out}$ to a low level, the now conducting logic condition transistors ICT1 and OCT discharge the gate of the AUCT for transient flow of sacrificial current through the AUCT primary current path. It is noted that as long as the output device is in the bistate mode of operation with a high level OE signal, the output enable condition transistor OECT1 is not conducting and does not interfere in the operation of the AUCT. In the high impedance third state the OECT1 functions as a tristate control transistor turning off the AUCT.

Following the propagation delay through the output buffer and transition of the output $V_{out}$ from high to low potential, the network OCN turns off the output condition transistor OCT. As a result current flow from the output power supply PV begins to charge the gate of the AUCT through the CPR and AUST. The control path resistance CPR slows the charging of the gate of PMOS transistor AUCT therefore delaying the turn off of AUCT permitting the transient flow of sacrificial current through the primary conducting path of the AUCT following transition from high to low potential at the output $V_{out}$.

If a ground undershoot event is detected a high level transient GUS turns off the switch transistor AUST increasing resistance in the path of current charging the gate of the AUCT further suppressing or retarding the turn off of sacrificial current flow. The sacrificial current flow is therefore prolonged during the transient occurrence of the detected ground undershoot event.

Figure 25:
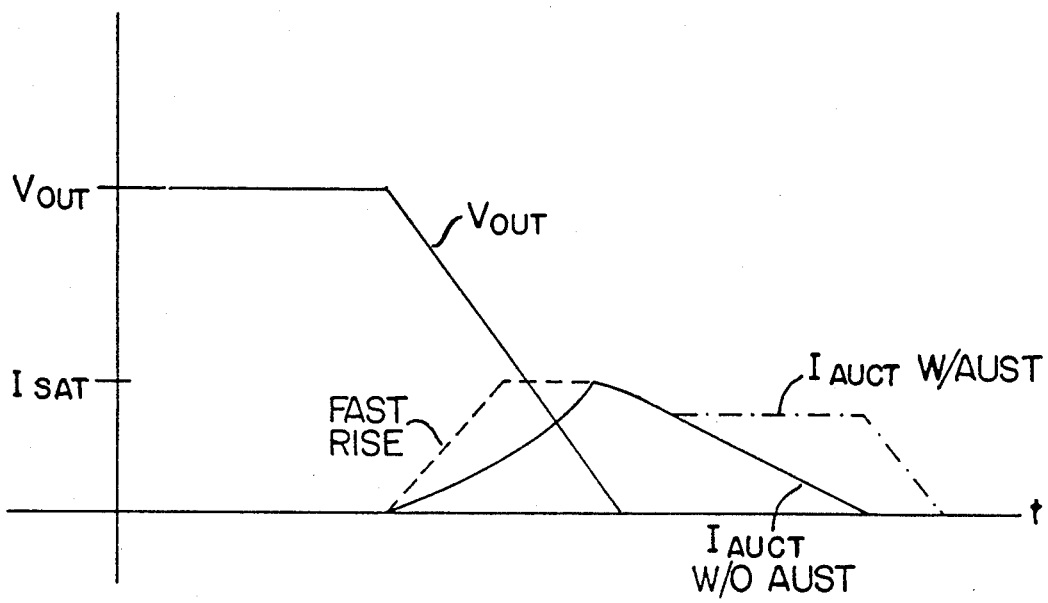
FIG. 25 is a graph of the current $I_{auct}$ through the primary current path of the AUCT of FIG. 24 showing the sacrificial current following transition from high to low potential at the output $V_{cc}$ without operation of the AUST, and with operation of the AUST prolonging the sacrificial current flow.

As illustrated in the graph of FIG. 25, the sacrificial current flow $I_{AUCT}$ rises during the transition from high to low potential at the output $V_{out}$ and continues following the transition until the gate of the AUCT is charged. With the AUST interposing a high resistance for the duration of a transient GUS, the transient $I_{AUCT}$ is prolonged for further dissipation of ground undershoot energy. An advantage of coupling the AUCT to the output through the OCT and OCN is further apparent in the graph of FIG. 25. The OCN and OCT prevent a fast rise in current through the primary current path of the AUCT and instead produce the more gradual concave rise of the solid line. Avoiding the fast rise avoids further disruption, noise and ringing in the power supply circuit and reduces power consumption.

The anti-bounce circuit for the tristate output buffer of FIG. 24 incorporates the tristate control transistors, PMOS transistor P7 and NMOS transistor N7 as the anti-bounce transistor elements of the anti-bounce circuit. The TCT's P7 and N7 are normally conducting in the bistate mode of operation presenting only a very low resistance to the propagation of data signals through the buffer. Upon detection of a ground bounce event by a GBD circuit such as the circuit of FIG. 7 a transient GBS of low potential is applied at the GBS input terminal drawing the current flow through the anti-bounce logic condition transistors ICT2 and OECT2. In the bistate mode of operation with a high level OE signal, the output enable condition transistor OECT2 is conducting. Similarly, with the appearance of a low level signal at the input $V_{in}$ the network DIN delivers a high level signal to input condition transistor ICT2 so that it also is conducting. A low potential is therefore applied at the gate of anti-bounce NMOS transistor element N7 while a high level potential is applied at the gate of the anti-bounce PMOS transistor element P7.

Both the ABT's P7 and N7 are in the control path circuit of the pulldown transistor N2 and the transient turn off of transistors P7 and N7 increases resistance suppressing turn on of the pulldown transistor element N2 for the duration of the detected ground bounce event and ground bounce signal GBS. Upon correction of the ground bounce the GBS input signal rises to the normal high condition blocking current flow through the anti-bounce logic condition transistors ICT2 and OECT2. As a result the ABT's P7 and N7 conduct once again completing the turn on of pulldown transistor N2 and the transition from high to low potential at the output $V_{out}$. The TCTs P9 and N9 remain nonconducting during the bistate mode of operation with a high level OE signal and do not interfere in the operation of the anti-bounce circuit or the propagation through the output buffer.

Figure 26:
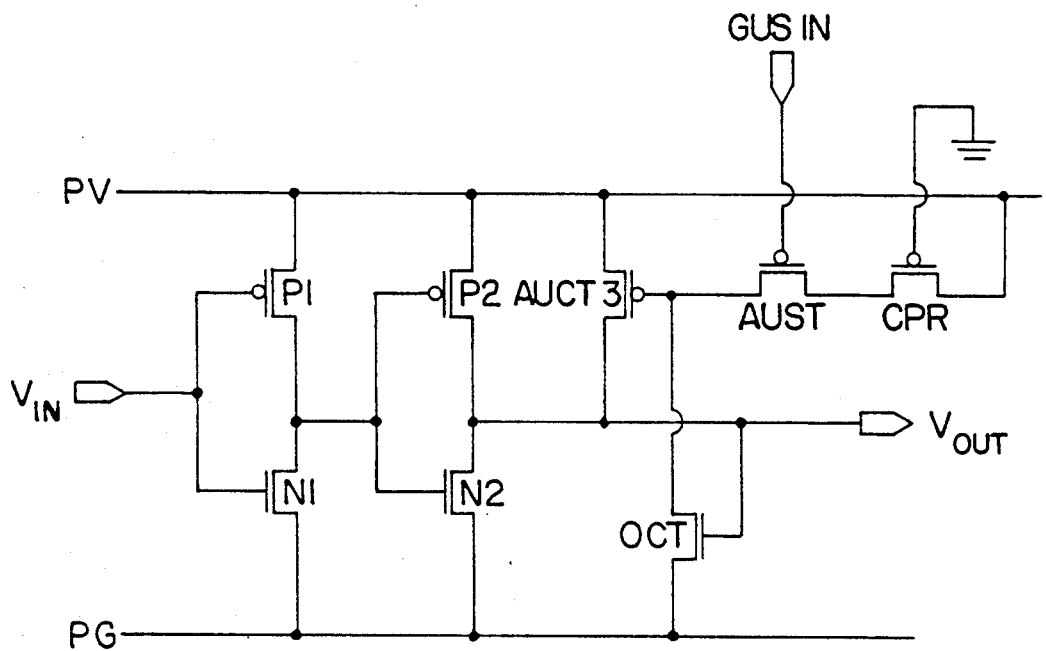
FIG. 26 is a schematic diagram of a fourth embodiment of the anti-undershoot circuit implemented in MOS.

Yet a fourth embodiment of the anti-undershoot circuit tied to the output $V_{out}$ of an output stage buffer is illustrated in FIG. 26. In this example the anti-undershoot circuit transistor AUCT3 is coupled with its primary current path in parallel with the pullup transistor P2. However the gate node of AUCT3 is not coupled in parallel with the gate node of P2 at the input and is rather coupled for operation in response to the output condition through output condition transistor OCT. With a high level signal at the output $V_{out}$ the output condition transistor OCT is conducting, discharging current in the control path circuit of AUCT3 and discharging the gate of AUCT3 so that it is conducting. As a result the AUCT3 sources current to the output $V_{out}$ in parallel with the pullup transistor element P2 maintaining the high level potential.

Upon transition from high to low potential at the output $V_{out}$, the transistor OCT turns off permitting current from the output supply PV to charge the gate of AUCT3 through the control path resistance CPR. The resistance CPR retards turn off of AUCT beyond turn off of the pullup transistor element P2 permitting a transient flow of sacrificial through AUCT3, pulldown transistor N2, and the parasitic output ground tank circuit including the output ground lead inductance. Undershoot energy is therefore dissipated in the resistance of the anti-undershoot circuit transistor AUCT3 whose channel width and channel resistance are selected accordingly. Upon detection of a ground undershoot event by a GUD circuit such as the circuit of FIG. 10 the transient GUS of high potential turns off the switch transistor AUST further prolonging turn off of AUCT3. The transient flow of sacrificial current is prolonged until the ground undershoot energy is dissipated.

While some of the example embodiments have been described with reference to both unipolar and bipolar technology implementation, it is apparent that other examples may also be embodied in either of the available technologies, and the invention is intended to cover all modifications and equivalents within the scope of the following claims.

I claim:

1. An anti-noise circuit for suppressing ground bound and $V_{cc}$ droop in the power rails of an integrated circuit device having an input stage with ground and supply relatively quiet power rails and an output stage with switching output transistor elements and ground and supply output power rails characterized by lead inductance, said output power rails being subject to power rail transient voltage noise upon switching of the output transistor elements, said anti-noise circuit comprising:

a power rail noise detector circuit operatively coupled for detecting a transient voltage difference in an output power rail relative to a quiet power rail upon switching of an output transistor element and for generating a transient power rail noise signal (PRNS) during occurrence of the detected transient voltage difference;

and a noise control circuit means having an anti-noise transistor element operatively coupled to at least one output detector circuit, said anti-noise transistor element having a control node coupled to receive the PRNS for transient suppression of turn on of said output transistor element during transient occurrence of a PRNS.

2. The anti-noise circuit of claim 1 wherein the output transistor elements comprise a pullup transistor element and a pulldown transistor element, wherein the power rail noise detector circuit comprises a ground bounce detector circuit generating a transient ground bounce signal (GBS) during transient occurrence of ground bounce in the ground output power rail, and wherein the anti-noise transistor element's control node is coupled to receive the GBS for transient suppression of turn on of the pulldown transistor element during transient occurrence of a GBS.

3. The anti-noise circuit of claim 1 wherein the output transistor elements comprise a pullup transistor element and a pulldown transistor element, wherein the power rail noise detector circuit comprises a supply droop detector circuit generating a transient supply droop signal (VDS) during transient occurrence of $V_{cc}$ droop in the supply output power rail and wherein the anti-noise transistor element's control node is coupled to receive the VDS for transient suppression of turn on of the pullup transistor element during transient occurrence of a VDS.

4. The anti-noise circuit of claim 2 wherein the power rail noise detector circuit also comprises a supply droop detector circuit generating a transient supply droop signal (VDS) during transient occurrence of $V_{cc}$ droop in the supply output power rail, and wherein the anti-noise transistor element is also operatively coupled to the pullup transistor element with said control node coupled to receive the VDS for transient suppression of turn on of the pullup transistor element during transient occurrence of a VDS.

5. An anti-noise circuit for suppressing ground bounce and $V_{cc}$ droop in the power rails of an integrated circuit device having an output stage with switching output transistor elements and ground and supply output power rails characterized by lead inductance, said output power rails being subject to power rail transient voltage noise upon switching of the output transistor elements, said anti-noise circuit comprising:

a power rail transient voltage noise detector circuit operatively coupled for detecting a transient voltage drop across the output power rail lead inductance upon switching of an output transistor element and for generating a transient power rail noise signal (PRNS) during occurrence of the detected transient voltage drop;

and a noise control circuit means having an anti-noise transistor element operatively coupled to at lest one switching output transistor element of the output stage and to the power rail transistor voltage noise detector circuit, said anti-noise transistor element having a control node coupled to receive the PRNS for transient suppression of turn on of said output transistor element during transient occurrence of a PRNS.

6. An anti-ground bounce circuit for a multi-stage circuit having at least one input stage with internal ground line comprising a relatively quiet ground (QG) and at least one output stage with an output ground line comprising an output ground (PG), said internal and output ground lines being relatively isolated, said output stage comprising an input for receiving data signals of high and low potential and an output for delivering data signals, an output pulldown transistor element coupled between the output and output ground PG for sinking current from the output to output ground, and an output pullup transistor element coupled between a power supply current source and the output for sourcing current from high potential to the output, said transistor elements comprising a primary current path and primary current path first and second nodes, and a control node and control circuit for controlling the conducting state of the primary current path, said anti-ground bounce circuit comprising:

a ground bounce detector circuit for generating a transient ground bounce signal (GBS) during transient occurrence of ground bounce of potential in the output ground relative to the quiet ground; and an anti-bounce transistor element (ABT) having the primary current path first and second nodes coupled in the control circuit of the output pulldown transistor element; said anti-bounce transistor element comprising a low resistance in its primary current path in a conducting state and a high resistance in a non conducting state, the control node of said anti-bounce transistor element being coupled to the ground bounce detector circuit for transient increase of resistance in the control circuit of the output pulldown transistor element during a transient GBS from the ground bounce detector circuit for transient suppression of turn on of the output pulldown transistor element thereby reducing ground bounce in the output ground.

7. The anti-ground bounce circuit of claim 6 wherein said transistor elements comprise MOS transistors.

8. The anti-ground bounce circuit of claim 7 wherein the pulldown transistor element and anti-bounce transistor element comprise NMOS transistor elements.

9. The anti-ground bounce circuit of claim 7 wherein the pulldown transistor element comprises a PMOS transistor element and the anti-bounce transistor element comprises an NMOS transistor element.

10. The anti-ground bounce circuit of claim 6 wherein said transistor elements comprise bipolar transistors.

11. The anti-ground bounce circuit of claim 10 wherein the pulldown transistor element and anti-bounce transistor element comprise NPN transistors.

12. The anti-ground bounce circuit of claim 6 wherein said output stage comprises first and second current amplification stages, wherein the pulldown transistor element is in the second current amplification stage, and wherein the anti-bounce transistor element is coupled with its primary current path in series between the first amplification stage and the control node of the pulldown transistor element.

13. The circuit of claim 6 wherein said input stage includes an internal $V_{cc}$ supply line comprising a relatively quiet supply (QV) and said output stage comprises an output $V_{cc}$ supply line comprising an output supply (PV), said internal and output supply lines being relatively isolated, said circuit including an anti $V_{cc}$ droop circuit comprising:

a $V_{cc}$ droop detector circuit for generating a transient $V_{cc}$ droop signal (VDS) during transient occurrence of $V_{cc}$ droop in the output supply PV relative to the quiet supply QV; and an anti-droop transistor element (ADT) having first and second primary current path nodes coupled in the control circuit of the output pullup transistor element, said anti-droop transistor element comprising a low resistance in its primary current path in a conducting state and a high resistance in the nonconducting state, the control node of said anti-droop transistor element being coupled to the $V_{cc}$ droop detector circuit for transient increase of resistance in the control circuit of the output pullup transistor element during a transient VDS from the $V_{cc}$ droop detector circuit for transient suppression of turn on of the output pullup transistor element thereby reducing $V_{cc}$ droop in the output supply PV.

14. The circuit of claim 13 wherein the transistor elements comprise MOS transistors, the pullup transistor element comprises a PMOS transistor, and the anti-droop transistor element comprises an NMOS transistor element.

15. The circuit of claim 13 wherein the ABT and ADT comprise the same transistor element.

16. The anti-ground bounce circuit of claim 6 wherein the output stage comprises a tristate device with tristate control transistor elements (TCT), at least one TCT being coupled in the control circuit of the pulldown transistor element and wherein said TCT comprises the ABT.

17. An anti-$V_{cc}$ droop circuit for a multi-stage circuit having at least one input stage with internal $V_{cc}$ supply line comprising a relatively quiet supply (QV) and at least one output stage with an output $V_{cc}$ supply line comprising an output supply (PV) said internal and output supply lines being relatively isolated, said output stage comprising an input for receiving data signals of high and low potential and an output for delivering data signals, an output pulldown transistor element coupled between the output and ground for sinking current from the output to ground, and an output pullup transistor element coupled between the output supply PV current source and the output for sourcing current from high potential to the output, said transistor elements comprising a primary current path and primary current path first and second nodes, and a control node and control circuit for controlling the conducting state of the primary current path, said anti-$V_{cc}$ droop circuit comprising:

a $V_{cc}$ droop detector circuit for generating a transient $V_{cc}$ droop signal (VDS) during transient occurrence of $V_{cc}$ droop in the output supply PV relative to the quiet supply QV; and an anti-droop transistor element having the primary current path first and second nodes coupled in the control circuit of the output pullup transistor element, said antidroop transistor element comprising a low resistance in its primary current path in a conducting state and a high resistance in a nonconducting state, the control node of said anti-droop transistor element being coupled to the $V_{cc}$ droop detector circuit for transient increase of resistance in the control circuit of the output pullup transistor element during a transient VDS from the $V_{cc}$ droop detector circuit for transient suppression of turn on of the output pullup transistor element thereby reducing $V_{cc}$ droop in the output supply PV.

18. The circuit of claim 17 wherein the transistor elements comprise MOS transistors.

19. The circuit of claim 18 wherein the output pullup transistor element comprises a PMOS transistor element and the anti-droop transistor element comprises an NMOS transistor element.

20. The circuit of claim 17 wherein said transistor elements comprise bipolar transistors.

21. The circuit of claim 20 wherein the output pullup transistor element and anti-droop transistor element comprise NPN transistors.

22. The circuit of claim 17 wherein the output stage comprises first and second current amplification stages, wherein the pullup transistor element is included in the second current amplification stage, and wherein said antidroop transistor element is coupled with the primary current path in series between the first current amplification stage and the control node of said output pullup transistor element.

23. An anti-ground noise circuit for a multi-stage circuit having at least one input stage with internal ground line comprising a relatively quiet ground (QG) and at least one output stage with an output ground line comprising an output ground (PG), said internal and output ground lines being relatively isolated, said output stage comprising an input for receiving data signals of high and low potential and an output for delivering data signals, an output pulldown transistor element coupled between the output and output ground for sinking current from the output to output ground, said transistor elements comprising a primary current path and primary current path first and second nodes, and a control node and control node circuit for controlling the conducting state of the primary current path, said antiground noise circuit comprising:
- a ground noise detector circuit for generating a transient ground noise signal (GNS) during transient occurrence of ground noise in the output ground relative to the quiet ground in excess of a selected threshold level; and
- an anti-noise transistor element (ANT) having the primary current path first and second nodes coupled in the control circuit of the output pulldown transistor element, the control node of said anti-noise transistor element being coupled to the ground noise detector circuit for transient change of conducting state of the primary current path of the output pulldown transistor element during a transient GNS from the ground noise detector circuit for transient suppression of turn on of the output pulldown transistor element thereby reducing ground noise in the output ground; and
- an ANT control circuit operatively coupled to the ANT control node and the ground noise detector circuit for further controlling the conducting state of the ANT primary current path in response to the logic condition of the output stage, said ANT control circuit comprising a data input condition transistor element (ICT2) for conditioning control of said ANT according to the data signal at the input to the output stage.

24. The anti-ground noise circuit of claim 23 wherein the output stage is a tristate device with tristate output enable signal OE and wherein the ANT control circuit further comprises an output enable condition transistor (OECT2) for conditioning control of said ANT according to the state of the OE signal and wherein the tristate device comprises tristate control transistor elements (TCT) for disabling the pulldown transistor element in the high impedance third state, said ANT comprising at least one TCT.

25. An anti-noise circuit for dissipating parasitic tank circuit energy causing ground undershoot and $V_{cc}$ overshoot in the power rails of an integrated circuit device having an output stage with switching output transistor elements and ground and supply output power rails characterized by lead inductance, said output power rails being subject to power rail transient voltage noise upon switching of the output transistor elements comprising:
- a current source for sourcing a transient sacrificial current flow;
- an anti-noise circuit transistor element (AUCT, AOCT, AUCT1, AUCT2) separate from the switching output transistor elements having a primary current path and selected resistance in the primary current path providing dissipating resistance means, said anti-noise circuit transistor element having a control node for controlling the conducting state of the anti-noise circuit transistor element;
- said anti-noise circuit coupling the current source, said anti-noise circuit transistor element with dissipating resistance means, and said power rail lead inductance in series in a sacrificial current path;
- and control circuit means coupled to the control node of the anti-noise circuit transistor element for causing a transient sacrificial current flow in the sacrificial current path following switching of an output transistor element for dissipating parasitic tank circuit energy in said dissipating resistance means.

26. The anti-noise circuit of claim 25 wherein the switching output transistor elements comprise a pullup transistor element and a pulldown transistor element, wherein the anti-noise circuit couples the current source, anti-noise circuit transistor element with dissipating resistance means (AUCT, AUCT1, AUCT), and ground output power rail lead inductance in series in a sacrificial current path, and wherein the control circuit means is coupled to cause a transient sacrificial current flow in the sacrificial current path following switching of an output transistor element for dissipating parasitic ground undershoot energy from the ground output power rail in the dissipating resistance means.

27. The anti-noise circuit of claim 25 wherein the switching output transistor elements comprise a pullup transistor element and a pulldown transistor element, wherein the anti-noise circuit coupled the current source, anti-noise circuit transistor element with dissipating resistance means (AOCT), and supply output power rail lead inductance in series in the sacrificial current path, and wherein the control circuit means is coupled to cause transient sacrificial current flow in the sacrificial current path following switching of an output transistor element for dissipating parasitic $V_{cc}$ overshoot energy from the supply output power rail in the dissipating resistance means.

28. The anti-noise circuit of claim 25 wherein the control circuit means comprises a power rail noise detector circuit operatively coupled for detecting a transient voltage noise in a power rail and for generating a transient power rail noise signal (PRNS) during occurrence of the detected transient voltage noise, said PRNS being coupled by the control circuit means to a control node of the anti-noise circuit transistor element to cause transient sacrificial current flow in the sacrificial current path.

29. An anti-undershoot circuit for an integrated circuit having at least one output stage with an output ground lead comprising an output ground (PG), and an output supply lead comprising an output supply (PV), said output stage comprising an input for receiving data signals of high and low potential and an output for delivering data signals, an output pulldown transistor element coupled between the output and output ground PG for sinking current from the output to output ground, and an output pullup transistor element coupled between the output supply PV and the output for sourcing current from the output supply to the output, said transistor elements each comprising a primary current path and primary current path first and second nodes, and a control node and control circuit for controlling the conducting state of the primary current path, said output ground being subject to ground noise including ground undershoot of potential due to output ground lead inductance during transition from high to low potential at the output, said anti-undershoot circuit comprising:

an anti-undershoot circuit transistor element (AUCT) having the primary current path first and second nodes coupled in an anti-undershoot circuit, said anti-undershoot circuit comprising the current source, the primary current path of the AUCT, and said output ground lead inductance coupled in series;

an AUCT control circuit coupled to the control node of the AUCT for establishing transient flow of a sacrificial current from said current source through the AUCT primary current path and through the output ground lead inductance, said AUCT comprising selected resistance in the primary current path in he conducting state for dissipating undershoot electrical energy from the output ground lead inductance thereby damping ground undershoot of potential in the output ground.

30. The anti-undershoot circuit of claim 29 wherein the AUCT control circuit comprises:

an undershoot detector circuit generating a transient ground undershoot signal (GUS) during transient occurrence of undershoot of potential in the output ground said GUS being coupled to the AUCT control node for causing transient flow of sacrificial current through the selected resistance of the AUCT primary current path and said output ground lead inductance, for dissipating undershoot electrical energy stored in the output ground lead inductance.

31. The anti-undershoot circuit of claim 29 wherein the integrated circuit comprises an input stage with input ground lead comprising a relatively quiet ground QG and wherein the control node of the AUCT is coupled to and QG whereby the AUCT also functions as a ground undershoot detector circuit generating a transient ground undershoot signal (GUS) at the AUCT control node during transient occurrence of undershoot of potential in the output ground PG for causing the transient sacrificial current flow.

32. The anti-undershoot circuit of claim 29 wherein the anti-undershoot circuit is coupled between the output supply PV and output ground PG through the output of said output stage, wherein the primary current path first and second nodes of the AUCT are coupled in parallel with the primary current path first and second nodes of the pullup transistor element, and further comprising an anti-undershoot control path resistance element (CPR) coupled in the control circuit of the AUCT, said AUCT control circuit being coupled to the control node of the pullup transistor element through said CPR, sand CPR retarding turn off of the AUCT following transition from high to low potential at the output thereby establishing the transient sacrificial current flow through the primary current path resistance of the AUCT and the output ground lead inductance for dissipation of undershoot electrical energy stored in the output ground lead inductance.

33. The anti-undershoot circuit of claim 29 wherein the respective primary current path first nodes of the AUCT and pullup transistor element are coupled to the output supply PV, the respective primary current path second nodes of the AUCT and pullup transistor element are coupled to the output of said output stage, and the control node of the AUCT is coupled to the control node of the pullup transistor element through a control path resistance element (CPR) for retarding turn off of the AUCT thereby establishing the transient sacrificial current flow.

34. The anti-undershoot circuit of claim 33 further comprising:

an anti-undershoot switch transistor element (AUST) having the primary current path first and second nodes coupled in series with the CPR, and an undershoot detector circuit, generating a transient ground undershoot signal (GUS) during occurrence of transient undershoot of potential in the output ground;

said GUS being coupled to the control node of the AUST for further retarding turn off of the AUCT following transition from high t low potential at the output thereby prolonging said transient flow of sacrificial current through the resistance of the AUCT primary current path and output ground lead inductance for further dissipating undershoot electrical energy stored in the output ground lead inductance.

35. The anti-undershoot circuit of claim 29 wherein the AUCT control circuit comprises an anti-undershoot control path resistance element (CPR) coupled between the output supply PV and the control node of the AUCT for sourcing current to the control node of the AUCT through said CPR resistance element, and a logic condition transistor element having the primary current path operatively coupled to the control node of the AUCT, the control node of said logic condition transistor element being operatively coupled to said output stage for conditioning and controlling the conducting state of the AUCT in response to the logic condition of the output stage, said CPR retarding turn off of the AUCT following transition from high to low potential at the output thereby establishing the transient sacrificial current flow through the dissipating selected resistance of the primary current path of the AUCT and the power ground lead inductance for dissipating undershoot electrical energy stored in the output ground lead inductance.

36. The anti-undershoot circuit of claim 35 further comprising:

an anti-undershoot switch transistor element (AUST) having the primary current path first and second nodes coupled in series with the CPR resistor element;

and an undershoot detector circuit generating a transient ground undershoot signal (GUS) during occurrence of transient undershoot of potential in the output ground;

said GUS being operatively coupled to the control node of the AUST for further delaying turn off of the AUCT during occurrence of transient undershoot of potential in the output ground upon transition from high to low potential at the output thereby prolonging the transient flow of sacrificial current through the dissipating selected resistance of the AUCT primary current path, and the output ground lead inductance, for dissipating undershoot electrical energy stored in the output ground lead inductance.

37. The anti-undershoot circuit of claim 29 wherein the transistor elements comprise MOS transistor elements.

38. The anti-undershoot circuit of claim 29 wherein said transistor elements comprise bipolar transistor elements.

39. An anti-undershoot circuit for a multi-stage circuit having an output stage with output ground lead providing an output ground (PG) and output supply lead providing an output supply (PV), said output ground lead being characterized by ground lead inductance, said output stage comprising an input for receiving data signals of high and low potential, an output for delivering data signals, an output pulldown transistor element coupled between the output and output ground PG for sinking current from the output to output ground, and an output pullup transistor element coupled between the output supply PV and the output for sourcing current from the output supply to the output, said transistor elements each comprising a primary current path and primary current path first and second nodes, and a control node for controlling the conducting state of the primary current path, said output ground PG being subject to ground noise including ground potential undershoot due to ground lead inductance during transition from high to low potential at the output, said antiundershoot circuit comprising:

an anti-undershoot circuit transistor element (AUCT) having the primary current path first and second nodes operatively coupled in an anti-undershoot circuit, said AUCT being constructed and arranged with selected resistance in the primary current path for dissipating sacrificial current, said anti-undershoot circuit comprising the output supply PV, said AUCT primary current path and primary current path selected resistance, and said output ground PG and output ground lead inductance all coupled in series;

and an AUCT control circuit coupled to the AUCT control node for controlling the conducting state of the AUCT, said AUCT control circuit being constructed to establish through the primary current path of the AUCT a transient sacrificial current flow in the anti-undershoot circuit from the output supply PV, through the AUCT primary current path and primary current path selected resistance, and through the output ground lead inductance, following transition from high to low potential at the output, for dissipating undershoot electrical energy stored in the output ground lead inductance;

said AUCT control circuit comprising an anti-undershoot control path resistance element (CPR) coupled between the output supply and the AUCT control node for retarding turn off of the AUCT to establish said transient sacrificial current, and at least one logic condition transistor operatively coupled for controlling the conducting state of the AUCT in accordance with the logic condition of the output stage.

40. The anti-undershoot circuit of claim 39 wherein the AUCT is coupled at the primary current path second node to output ground through the output of said output stage.

41. The anti-undershoot of claim 39 wherein the AUCT control circuit comprises a plurality of logic condition transistor elements including a data input condition transistor ICT and an output condition transistor OCT operatively coupled with the respective primary current paths in series between the AUCT control node and output ground, said output supply being coupled to the AUCT control node through the CPR resistance element, said ICT being conditioned by the signal at the input of the output stage and said OCT being conditioned by the signal at the output of the output stage to control transient conduction through the primary current path of the AUCT associated with transition from high to low potential at the output for establishing the transient sacrificial current in the anti-undershoot circuit from the output supply, through the AUCT primary current path and primary current path selected resistance, and through the output ground lead inductance, for dissipating electrical energy stored in the power ground lead inductance.

42. The anti-undershoot circuit of claim 39 further comprising an anti-undershoot switch transistor (AUST), said AUST primary current path first and second nodes being coupled in series with the CPR resistance element between the power supply current source and AUCT control node, and further comprising a ground undershoot detector circuit generating a transient ground undershoot signal (GUS) during occurrence of transient undershoot of potential in the output ground, said GUS being coupled to the control node of the AUST for retarding turn off of the transient flow of sacrificial current through the primary current path selected resistance of the AUCT, and through the output ground lead inductance, following transition from high to low potential at the output, for further dissipating electrical energy stored in the output ground lead inductance.

43. The anti-undershoot circuit of claim 41 further comprising an output network operatively coupled between the output and control node oft he OCT for conditioning propagation of an output condition signal to the control node of the OCT for effecting a slow rise in the sacrificial current during turn on of the AUCT to reduce interference in the output supply PV by the current requirements of the AUCT.

44. The anti-undershoot circuit of claim 39 wherein the output stage comprises a tristate output device with output enable (OE) signal and wherein the AUCT control circuit further comprises an output enable condition transistor element (OECT) operatively coupled to the AUCT control circuit for disabling the AUCT in the high impedance third state of the tristate output device.

45. A low noise circuit for a multi-stage circuit having at least one input stage with internal ground lead comprising a relatively quiet ground (QG) and at least one output stage with an output ground lead comprising an output ground (PG) and an output supply lead comprising an output supply (PV), said internal and output ground leads having lead inductance and being relatively isolated for coupling to an external ground, said output stage comprising an input for receiving data signals of high and low potential and an output for delivering data signals, an output pulldown transistor element coupled between the output and output ground for sinking current from the output to output ground, and an output pullup transistor element coupled between output supply and the output for sourcing current from the output supply to the output, said transistor elements each comprising a primary current path with primary current path first and second nodes, and a control node and control circuit for controlling the conducting state of the primary current path, said low noise circuit comprising:

an anti-undershoot circuit including an anti-undershoot circuit transistor element (AUCT) having the primary current path first and second nodes coupled in the anti-undershoot circuit, said AUCT being characterized by selected resistance in the primary current path in the conducting state providing dissipating resistance means, said anti-undershoot circuit defining a sacrificial current path by coupling the output supply, the AUCT primary current path and selected resistance, and said output ground lead inductance in series;

an AUCT control circuit operatively coupled to the control node of the AUCT and constructed for establishing a transient sacrificial current in the anti-undershoot circuit following transition from high to low potential at the output for dissipating undershoot electrical energy stored in the output ground lead inductance in said dissipating resistance means;

a ground bounce detector circuit for generating a transient ground bounce signal (GBS) during transient occurrence of ground bounce of potential in the power ground relative to the quiet ground;

an anti-bounce transistor element (ABT) having the primary current path first and second nodes coupled in the control circuit of the output pulldown transistor element, said ABT having a low resistance in its primary current path in a conducting state and a high resistance in a non-conducting state;

and an ABT control circuit including said ground bounce detector circuit operatively coupled to the control node of the ABT and constructed and arranged to cause transient increase of resistance in the control circuit of the output pulldown transistor element during a transient GBS from the ground bounce detector circuit for transient suppression of turn on of the output pulldown transistor element thereby suppressing ground bounce in the output ground.

46. The low noise circuit of claim 45 wherein the AUCT control circuit comprises a plurality of logic condition transistors for controlling the AUCT primary current path conducting state in response to the logic condition of said output stage.

47. The low noise circuit of claim 46 wherein the logic condition transistors include a data input condition transistor (ICT) and a data output condition transistor (OCT) operatively coupled to enable transient conductance by the AUCT upon transition from high to low potential at the output, said input condition transistor ICT and output condition transistor OCT being coupled with their respective primary current paths in series between the AUCT control node and output of the output stage.

48. The low noise circuit of claim 45 wherein the AUCT control circuit comprises an anti-undershoot control path resistance element (CPR) coupled between the output supply and said AUCT control node for delaying turn off of the AUCT and enabling a transient sacrificial flow of current in the anti-undershoot circuit following transition from high to low potential at the output.

49. The low noise circuit of claim 48 further comprising:

a ground undershoot detector circuit for generating a transient ground undershoot signal (GUS) during transient occurrence of ground undershoot of potential in the power ground relative to the quiet ground;

and an anti-undershoot switch transistor element (AUST) operatively coupled with the primary current path in series with said CPR resistance element between the output supply and AUCT control node, the control node of said AUST being coupled to the ground undershoot detector circuit for further delaying turn off of the AUCT and extending transient sacrificial current flow in the anti-undershoot circuit during a transient GUS from the ground undershoot detector circuit for further dissipation of undershoot electrical energy from the output ground lead inductance in the resistance of the AUCT.

50. The low noise circuit of claim 45 wherein the ABT control circuit comprises at least one logic condition transistor for controlling the conducting state of the ABT in response to a logic condition of the output stage.

51. The low noise circuit of claim 50 wherein a logic condition transistor of the ABT control circuit comprises a data input condition transistor (ICT2) having the primary current path coupled to the control node of the ABT for conditioning control of the conducting state of the ABT primary current path in response to the data signal at the input of the output stage.

52. The low noise circuit of claim 51 wherein the output stage comprises a tristate device with a tristate output enable (OE) signal and wherein a further logic condition transistor of the ABT control circuit includes an output enable condition transistor (OECT2) having the primary current path coupled to the control node of the ABT for conditioning control of the conducting state of the ABT primary current path in response to the condition of the tristate device OE signal.

53. The low noise circuit of claim 45 wherein the output stage comprises a tristate output device with output enable (OE) signal and tristate control transistor elements (TCT's) with at least one TCT being coupled in the control circuit of the pulldown transistor element for disabling the pulldown transistor element during the tristate condition, and wherein said at least one TCT also comprises the ABT.

54. An anti-overshoot circuit for a multi-stage circuit having an output stage with an output $V_{cc}$ supply lead comprising an output supply (PV) said output supply lead having lead inductance said output stage comprising an input for receiving data signals of high and low potential and an output for delivering data signals, an output pulldown transistor element coupled between the output and ground for sinking current from the output to ground, and an output pullup transistor element coupled between the output supply (PV) and the output for sourcing current from the output supply to the output, said transistor elements comprising a primary current path and primary current path first and second nodes, and a control node and control circuit for controlling the conducting state of the primary current path, said anti-overshoot circuit comprising:

an anti-overshoot circuit transistor element (AOCT) having the primary current path first and second nodes coupled in an antiovershoot circuit, said anti-overshoot circuit coupling the output supply PV, primary current path of the AOCT, ground, and output supply lead inductance in series;

an AOCT control circuit coupled to the control node of the AOCT for establishing transient flow of a sacrificial current through the AOCT primary current path from said output supply PV and through the output supply lead inductance, said AOCT comprising selected resistance in the primary current path in the conducting state providing dissipating resistance means for dissipating overshoot electrical energy stored in the output supply PV lead inductance.

55. The anti-overshoot circuit of claim 54 wherein the AOCT control circuit comprises:
an overshoot detector circuit generating a transient $V_{cc}$ overshoot signal (VOS) during transient occurrence of overshoot of potential in the output supply PV, said VOS being couple d by the AOCT control circuit to the control node of the AOCT for causing transient flow of sacrificial current through the selected resistance of the AOCT primary current path and output supply lead inductance, for damping and dissipating the overshoot electrical energy from the output supply PV lead inductance.

56. The anti-overshoot circuit of claim 54 wherein the control node of the AOCT is coupled to a relatively quiet reference supply whereby the AOCT also functions as an overshoot detector circuit generating a transient $V_{cc}$ overshoot signal (VOS) at its own AOCT control node during transient occurrence of overshoot of potential in the output supply PV relative to the quiet reference supply.

57. A ground noise detector circuit for a multi-stage circuit having at least one input stage with internal ground line comprising a relatively quiet ground (QG) and at least one output stage with an output ground line comprising an output ground (PG) said internal and output ground lines being relatively isolated, said output stage comprising an output for delivering data signals of high and low potential, said output ground being subject to ground noise including ground bounce and ground undershoot during transition from high to low potential at the output, said ground noise detector circuit comprising:
a ground noise detector transistor element having primary current path first and second nodes defining the transistor element primary current path, and a control node for controlling the conducting state of the primary current path, power supply circuit means coupled to said first node, said control node being coupled to one of the quiet ground and output ground, and said second node of the primary current path being coupled to the other of the quiet ground and output ground for generating at the first node of the primary current path a transient ground noise signal (GNS) during transient occurrence of ground potential differential between the quiet ground and output ground causing transient change in the conducting state of the primary current path of the ground noise detector transistor element.

58. The ground noise detector circuit of claim 57 wherein the ground noise detector transistor element comprises a ground bounce detector (GBD) transistor element, wherein said control node is coupled to the output ground and the second node of the primary current path is coupled to the quiet ground for generating at the first node of the primary current path a transient ground bounce signal (GBS) during transient occurrence of ground bounce of potential in the output ground relative to the quiet ground causing transient change in the conducting state of the primary current path of the GBD transistor element.

59. The ground noise detector circuit of claim 58 wherein the GBD transistor element is an MOS transistor element.

60. The ground nose detector circuit of claim 58 wherein the GBD transistor element is a bipolar transistor element.

61. The ground noise detector circuit of claim 59 wherein the GBD MOS transistor element is an NMOS transistor element, and wherein the first node is the drain node, the second node the source node, and control node the gate node.

62. The ground noise detector circuit of claim 60 wherein the GBD bipolar transistor element is an NPN transistor element, and wherein the first node is the collector node, the second node is the emitter node, and control node the base node.

63. The ground noise detector circuit of claim 58 further comprising a noninverting stage of current amplification coupled to receive the transient GBS and wherein the ground noise detector circuit delivers a final transient GBS of low potential during transient occurrence of ground bounce of potential in the output ground.

64. The ground noise detector circuit of claim 58 further comprising an inverting stage of current amplification coupled to receive the transient GBS and wherein the ground noise detector circuit delivers a final transient GBS of high potential during transient occurrence of ground bounce of potential in the output ground.

65. The ground noise detector circuit of claim 61 wherein the power supply circuit means coupled to said first pin of the GBS NMOS transistor element comprises a PMOS transistor element coupled between said first pin of the NMOS transistor element and a $V_{cc}$ power supply.

66. The ground noise circuit of claim 57 wherein the ground noise detector transistor element comprises a ground undershoot detector (GUD) transistor element, wherein said control node is coupled to quiet ground, and said second node of the primary current path is coupled to output ground for generating at the first node of the primary current path a transient ground undershoot signal (GUS) during transient occurrence of ground undershoot of potential in the output ground relative to the quiet ground causing transient change in the conducting state of the primary current path of the GUD transistor element.

67. The ground noise detector circuit of claim 66 wherein the GUD transistor element is an NMOS transistor and wherein the first node is the drain node, second node the source node, and control node the gate node.

68. The ground noise detector circuit of claim 66 wherein the GUD transistor element is a bipolar NPN transistor, wherein the first node is the collector node, the second node is the emitter node, and control node the base node.

69. The ground noise detector circuit of claim 66 further comprising an inverting stage of current amplification coupled to receive the transient GUS and wherein the ground noise detector circuit delivers a final transient GUS of high potential during transient occurrence of ground undershoot of potential in the output ground.

70. The ground noise detector circuit of claim 67 wherein the power supply circuit means coupled to the first pin of the GUD transistor element comprises a PMOS transistor coupled between said first node and a $V_{cc}$ power supply.

71. A ground bounce detector (GBD) circuit for a multistage circuit having at least one input stage with internal ground line comprising a relatively quiet ground (QG) and at least one output stage with an output ground line comprising an output ground (PG), said internal and output ground lines being relatively isolated, said output stage comprising an output for delivering data signals of high and low potential, said output ground being subject to ground bounce of potential during transition from high to low potential at the output, said ground bounce detector circuit comprising:

a ground bounce detector (GBD) transistor element having primary current path first and second nodes defining the transistor element primary current path, and a control node for controlling the conducting state of the primary current path, power supply circuit means coupled to said first node, said control node being coupled to output ground, and said second node of the primary current path being coupled to quiet ground for generating at the first node of the primary current path a transient ground bounce signal (GBS) during transient occurrence of ground bounce of potential in the output ground relative to the quiet ground causing transient change in the conducting state of the primary current path of the GBD transistor element.

72. The ground bounce detector circuit of claim 71 further comprising a stage of current amplification coupled to receive the GBS.

73. The ground bounce detector circuit of claim 72 wherein the stage of current amplification comprises a noninverting stage of current amplification and wherein the GBD circuit delivers a transient GBS of low potential during transient occurrence of ground bounce of potential in the output ground.

74. A ground undershoot detector (GUD) circuit for a multistage circuit having at least one input stage with internal ground line comprising a relatively quiet ground (QG) and at least one output stage with an output ground line comprising an output ground (PG) said internal and output ground lines being relatively isolated, said output stage comprising an output for delivering data signals of high and low potential, said ground being subject to ground undershoot during transition from high to low potential at the output, said ground undershoot detector circuit comprising:

a ground undershoot detector (GUD) transistor element having primary current path first and second nodes defining the transistor element primary current path and a control node for controlling the conducting state of the primary current path, power supply circuit means coupled to said first node, said control node being coupled to quiet ground, and said second node of the primary current path being coupled to output ground for generating at the first node of the primary current path a transient ground undershoot signal (GUS) during transient occurrence of ground undershoot of potential in the output ground relative to the quiet ground causing transient change in the conducting state in the primary current path of the GUD transistor element.

75. The ground undershoot detector circuit of claim 74 further comprising a current amplification stage coupled to receive the GUS.

76. The ground undershoot circuit of claim 75 wherein the stage of current amplification comprises an inverting stage and wherein the GUD circuit delivers a final transient GUS of high potential during transient occurrence of ground undershoot of potential in the output ground.

77. A supply noise detector circuit for a multi-stage circuit having at least one input stage with internal $V_{cc}$ supply lead comprising a relatively quiet supply (QV) and at least one output stage with an output $V_{cc}$ supply lead comprising an output supply (PV) said internal and output supply leads being relatively isolated, said output stage comprising an output for delivering data signals of high and low potential, said output supply PV being subject to supply noise including $V_{cc}$ droop and overshoot during transition rom low to high potential at the output, said power noise detector circuit comprising:

a supply noise detector transistor element having primary current path first and second nodes defining the transistor element primary current path, and a control node for controlling the conducting state of the primary current path, ground circuit means coupled to said second node, said control node being coupled to one of the quiet supply QV and output supply PV, and said first node of the primary current path being coupled to the other of the quiet supply QV and output supply PV for generating at the second node of the primary current path a transient supply noise signal (VNS) during transient occurrence of supply potential differential between the quiet supply QV and output supply PV causing transient change in he conducting state of the primary current path of the supply noise detector transistor element.

78. The supply noise detector circuit of claim 77 wherein the supply noise detector transistor element comprises a $V_{cc}$ droop detector (VDD) transistor element, wherein said control node is coupled to the output supply PV, and the first node of the primary current path is coupled to the quiet supply QV for generating at the second node of the primary current path a transient $V_{cc}$ droop signal (VDS) during transient occurrence of $V_{cc}$ droop in potential in the output supply PV relative to the quiet supply QV causing transient change in the conducting state of the primary current path of the VDD transistor element.

79. The power noise detector circuit of claim 78 wherein the VDD transistor element is an MOS transistor element.

80. The power noise detector circuit of claim 78 wherein the VDD transistor element is a bipolar transistor element.

81. The power noise detector circuit of claim 79 wherein the VDD MOS transistor element is a PMOS transistor element, and wherein the first node is the source node, the second node the drain node, and control node the gate node.

82. The power noise detector circuit of claim 80 wherein the VDD bipolar transistor element is a PNP transistor element, and wherein the first node is the emitter node, the second node is the collector node, and control node the base node.

83. The power noise detector circuit of claim 78 further comprising a noninverting stage of current amplification coupled to receive the transient VDS and wherein the power noise detector circuit delivers a final transient VDS of high potential during transient occurrence of $V_{cc}$ droop in potential in the output supply PV.

84. The power noise detector circuit of claim 78 further comprising an inverting stage of current amplification coupled to receive the transient VDS and wherein the power noise detector circuit delivers a final transient VDS output of low potential during transient occurrence of $V_{cc}$ droop in potential in the output supply PV.

85. The power noise circuit of claim 77 wherein the power noise detector transistor element comprises a $V_{cc}$ overshoot detector (VOD) transistor element, wherein said control node is coupled to quiet supply QV, and said first node of the primary current path is coupled to output supply PV for generating at the second node of the primary current path a transient PV overshoot signal (VOS) output during transient occurrence of PV overshoot of potential in the output supply PV relative to the quiet supply QV causing transient change in the conducting state of the primary current path of the VOD transistor element.

86. The power noise detector circuit of claim 85 wherein the VOD transistor element is a PMOS transistor element and wherein the first node is the source node, second node the drain node, and control node the gate node.

87. The power noise detector circuit of claim 85 wherein the VOD transistor element is a bipolar PNP transistor element, wherein the first node is the emitter node, the second node is the collector node, and control node the base node.

88. The power noise detector circuit of claim 85 further comprising at least one stage of current amplification coupled to receive the transient VOS and wherein the power noise detector circuit delivers a final transient VOS of high potential during transient occurrence of PV overshoot of potential in the output supply PV.

* * * * *